United States Patent
Nakayamada et al.

(10) Patent No.: US 8,129,698 B2
(45) Date of Patent: Mar. 6, 2012

(54) CHARGED-PARTICLE BEAM WRITING METHOD AND CHARGED-PARTICLE BEAM WRITING APPARATUS

(75) Inventors: Noriaki Nakayamada, Kanagawa (JP); Seiji Wake, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 387 days.

(21) Appl. No.: 12/409,974

(22) Filed: Mar. 24, 2009

(65) Prior Publication Data
US 2009/0242787 A1 Oct. 1, 2009

(30) Foreign Application Priority Data

Mar. 25, 2008 (JP) .................................. 2008-077008
Dec. 25, 2008 (JP) .................................. 2008-331585

(51) Int. Cl.
*G21K 5/10* (2006.01)
(52) U.S. Cl. ............. 250/492.22; 250/492.1; 250/492.2; 250/492.23; 250/492.3
(58) Field of Classification Search ............... 250/492.1, 250/492.2, 492.22, 492.23, 492.3
See application file for complete search history.

(56) References Cited

U.S. PATENT DOCUMENTS

| | | | |
|---|---|---|---|
| 7,087,910 B2* | 8/2006 | Schneider et al. | 250/491.1 |
| 7,598,499 B2* | 10/2009 | Platzgummer | 250/398 |
| 2005/0287451 A1* | 12/2005 | Hudek et al. | 430/30 |
| 2007/0085031 A1* | 4/2007 | Lozes et al. | 250/492.1 |
| 2007/0187624 A1* | 8/2007 | Suzuki et al. | 250/492.22 |
| 2008/0067441 A1* | 3/2008 | Wake et al. | 250/492.21 |

FOREIGN PATENT DOCUMENTS

JP 2007-324175 12/2007

OTHER PUBLICATIONS

U.S. Appl. No. 12/948,178, filed Nov. 17, 2010, Nakayamada et al.
Maris A. Sturans, et al., "Positional errors due to substrate charging in e-beam lithography tools", SPIE, vol. 1604, 1991, pp. 36-44.
K. D. Cummings, et al., "Charging effects from electron beam lithography", J. Vac. Sci. Technol. B, vol. 7, No. 6, Nov./Dec. 1989, pp. 1536-1539.
Yongjae Lee, et al., "Calculation of surface potential and beam deflection due to charging effects in electron beam lithography", J. Vac. Sci. Technol. B, vol. 18, No. 6, Nov./Dec. 2000, pp. 3095-3098.
Benjamin Alles, et al., "Modeling the Work Piece Charging During e-Beam Lithography", SPIE, vol. 6924, 2008, 10 pages.
U.S. Appl. No. 12/843,367, filed Jul. 26, 2010, Nakayamada et al.
Office Action issued Sep. 21, 2011 in Korea Application No. 10-2009-24691 (With English Translation).

* cited by examiner

*Primary Examiner* — Michael Maskell
(74) *Attorney, Agent, or Firm* — Oblon, Spivak, McClelland, Maier & Neustadt, L.L.P.

(57) ABSTRACT

A pattern density distribution and a dose distribution calculated using the pattern density distribution are multiplied by each other to calculate an exposure distribution. A fogging electron amount distribution is calculated using the exposure distribution and a function descriptive of a fogging spread distribution. Charge amount distributions in irradiation and non-irradiation regions are calculated using the exposure distribution and the fogging electron amount distribution. A position displacement amount distribution is calculated using the charge amount distributions and a response function for converting a charge amount to a position displacement error.

20 Claims, 32 Drawing Sheets

| PATTERN DENSITY | $c_0$ | $c_1$ | $\sigma$ [mm] |
|---|---|---|---|
| 25% | $-1.24 \times 10^{-3}$ | $-1.372 \times 10^{-4}$ | 6 |
| 50% | $-1.35 \times 10^{-3}$ | $-2.116 \times 10^{-4}$ | 6 |
| 75% | $-1.27 \times 10^{-3}$ | $-2.472 \times 10^{-4}$ | 7 |
| 100% | $-1.81 \times 10^{-3}$ | $-3.154 \times 10^{-3}$ | 8 |

Fig.24B

| PATTERN DENSITY | $c_0$ | $c_1$ | $\sigma$ [mm] |
|---|---|---|---|
| 25% | $-7.16 \times 10^{-4}$ | $-9.41 \times 10^{-5}$ | 7 |
| 50% | $-1.28 \times 10^{-3}$ | $-1.64 \times 10^{-4}$ | 7 |
| 75% | $-1.58 \times 10^{-3}$ | $-2.40 \times 10^{-4}$ | 9 |
| 100% | $-1.66 \times 10^{-3}$ | $-2.44 \times 10^{-4}$ | 9 |

Fig.24C

| PATTERN DENSITY | $c_0$ | $c_1$ | $\sigma$ [mm] |
|---|---|---|---|
| 25% | $-6.36 \times 10^{-3}$ | $-1.07 \times 10^{-4}$ | 5 |
| 50% | $-2.03 \times 10^{-3}$ | $-1.83 \times 10^{-4}$ | 6 |
| 75% | $-2.70 \times 10^{-3}$ | $-2.57 \times 10^{-4}$ | 7 |
| 100% | $-2.84 \times 10^{-3}$ | $-3.07 \times 10^{-4}$ | 7 |

| PATTERN DENSITY | $c_0$ | $c_1$ | $\sigma$ [mm] |
|---|---|---|---|
| 25% | $-1.96 \times 10^{-4}$ | $-9.52 \times 10^{-5}$ | 7 |
| 50% | $-3.06 \times 10^{-4}$ | $-1.65 \times 10^{-4}$ | 7 |
| 75% | $-8.09 \times 10^{-4}$ | $-2.31 \times 10^{-4}$ | 8 |
| 100% | $-6.56 \times 10^{-4}$ | $-2.45 \times 10^{-4}$ | 9 |

| PATTERN DENSITY | $c_0$ | $c_1$ | $\sigma$ [mm] |
|---|---|---|---|
| 25% | $-4.26 \times 10^{-4}$ | $-1.090 \times 10^{-4}$ | 5 |
| 50% | $-2.65 \times 10^{-4}$ | $-1.838 \times 10^{-4}$ | 6 |
| 75% | $-1.05 \times 10^{-4}$ | $-2.544 \times 10^{-4}$ | 6 |
| 100% | $-6.25 \times 10^{-5}$ | $-3.038 \times 10^{-4}$ | 7 |

Fig.29

| PARAMETER | DOSE D: FIXED | | | | DOSE D: VARIABLE |
|---|---|---|---|---|---|
| | RESIST A | RESIST B | RESIST C | RESIST D | RESIST A |
| $d_0$ | 0.580 | 0.013 | -0.024 | -0.729 | -0.079 |
| $d_1$ | -0.864 | 0 | 0 | 0 | 0 |
| $d_2$ | -0.128 | 0 | 0 | 0 | 0 |
| $d_3$ | -0.016 | -0.0363 | -0.0731 | -0.165 | -0.079 |
| $e_1$ | 0 | -0.477 | -0.263 | 0 | 0 |
| $e_2$ | 0 | $8.69 \times 10^{-2}$ | $2.93 \times 10^{-2}$ | 0 | 0 |
| $e_3$ | 0 | $-5.36 \times 10^{-3}$ | $-1.36 \times 10^{-3}$ | 0 | 0 |
| $f_1$ | -0.642 | -0.450 | -0.452 | -0.579 | -0.259 |
| $f_2$ | $5.78 \times 10^{-2}$ | $1.70 \times 10^{-2}$ | $1.11 \times 10^{-2}$ | $8.70 \times 10^{-2}$ | -0.103 |
| $f_3$ | $-2.66 \times 10^{-3}$ | $2.95 \times 10^{-4}$ | $3.07 \times 10^{-4}$ | $-1.11 \times 10^{-2}$ | $-5.14 \times 10^{-3}$ |
| $\sigma$ [mm] | 13 | 16 | 13 | 10 | 8 |

— : POSITION DISPLACEMENT AMOUNT DISTRIBUTION
---- : EXPERIMENTAL DATA

— : POSITION DISPLACEMENT AMOUNT DISTRIBUTION
---- : EXPERIMENTAL DATA

CHARGED-PARTICLE BEAM WRITING METHOD AND CHARGED-PARTICLE BEAM WRITING APPARATUS

BACKGROUND OF THE INVENTION

1. Field of the Invention

The present invention relates to a charged-particle beam writing method and a charged-particle beam writing apparatus. More specifically, the present invention relates to the calculation and correction of a position displacement amount of a charged-particle beam due to a charging effect of a sample.

2. Background Art

With the introduction of a double patterning technique, there has been a demand for enhancement of position accuracy of a photomask. With its demand, there has been a demand for an improvement in pattern placement accuracy in the photomask. It has, however, been known that when a pattern of the photomask is written by an electron beam writing apparatus, a beam irradiation position is displaced or shifted due to a resist charging effect.

As one method for correcting this beam irradiation position displacement, there has been known a method for forming a charge dissipation layer (CDL) on a resist layer and preventing the charging of a resist surface. Since, however, the charge dissipation layer basically has an acid characteristic, it is incompatible with a chemical amplification resist. There is also a need to provide a new facility in order to form the charge dissipation layer, thus causing a further increase in the manufacturing cost of a photomask. Therefore, it is desirable to perform charging effect correction (CEC) without using the charge dissipation layer.

A writing apparatus for calculating a correction amount of a beam irradiation position, based on electric field strength and applying a beam based on the correction amount has been proposed in Japanese Patent Application Laid-Open No. 2007-324175. According to the writing apparatus, a position displacement amount distribution is calculated from an irradiation amount or exposure distribution through a linear response function assuming that a linear proportional relationship is established between the exposure distribution and a charge amount distribution.

According to further discussions of the present inventors, however, it has been found out that the position displacement amount distribution cannot be calculated with satisfactory accuracy assuming that the linear proportional relationship is established between the exposure distribution and the position displacement amount distribution. Therefore, the need for establishing a new model to determine the position displacement amount distribution with high accuracy without using such a linear proportional relationship has arisen.

SUMMARY OF THE INVENTION

An object of the present invention is to provide a charged-particle beam writing method and apparatus capable of calculating a distribution of a beam displacement amount due to a charging effect with satisfactory accuracy in terms of the above problems.

According to one aspect of the present invention, in a charged-particle beam writing method, a charged-particle beam is deflected and each pattern is written onto a sample placed on a stage. In the charged-particle beam writing method, a charge amount distribution in an irradiation region of the charged-particle beam and a charge amount distribution in a non-irradiation region thereof are calculated, using an exposure distribution of the charged-particle beam applied onto the sample, and a fogging electron amount distribution. Then, a distribution of a position displacement amount of the charged-particle beam on the sample is calculated, based on the charge amount distributions in the irradiation and non-irradiation regions. Then, the charged-particle beam is deflected, based on the distribution of the position displacement amount and writing each pattern onto the sample.

According to another aspect of the present invention, a charged-particle beam writing apparatus deflects a charged-particle beam by a deflector and writes each pattern onto a sample placed on a stage. The charged-particle beam writing apparatus comprises position displacement amount distribution calculating means for calculating a distribution of a position displacement amount of the charged-particle beam lying on the sample, based on a charge amount distribution in an irradiation region of the sample irradiated with the charged-particle beam, and a charge amount distribution in a non-irradiation region unirradiated therewith. And the charged-particle beam writing apparatus comprises deflector control means for controlling the deflector based on the distribution of the position displacement amount.

Another object and an advantage of the present invention are apparent from the following description.

BRIEF DESCRIPTION OF THE DRAWINGS

FIG. 24A is a diagram showing an optimum combination of parameters $c_0$, $c_1$ and $\sigma$ for the resist A;

FIG. 24B is a diagram showing an optimum combination of parameters $c_0$, $c_1$ and $\sigma$ for the resist B;

FIG. 24C is a diagram showing an optimum combination of parameters $c_0$, $c_1$ and $\sigma$ for the resist C;

FIG. 29 is a diagram showing optimum combinations of parameters $d_0$, $d_1$, $d_2$, $d_3$, $e_1$, $e_2$, $e_3$, $f_1$, $f_2$, $f_3$ and $\sigma$;

DETAILED DESCRIPTION OF THE PREFERRED EMBODIMENTS

Figure 1:
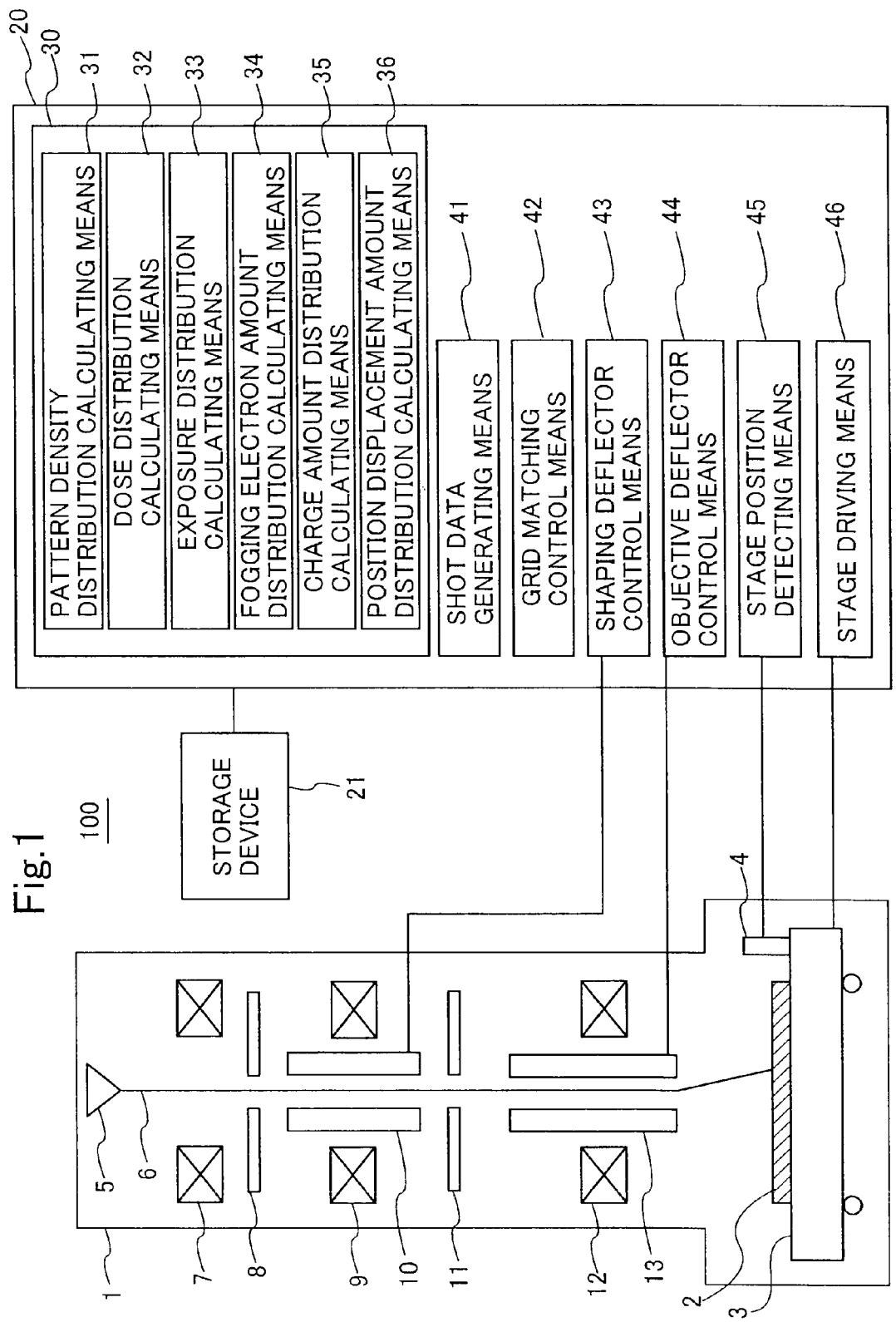
FIG. 1 is a schematic configuration diagram of an electron beam writing apparatus 100 according to an embodiment of the present invention.

FIG. 1 is a schematic configuration diagram of an electron beam writing apparatus 100 according to the present embodiment.

The electron beam writing apparatus 100 of variable-shaped beam system shown in FIG. 1 is equipped with a writing section 1. An XY stage 3 for holding a mask corresponding to a sample 2 is accommodated within the writing section 1. The mask corresponding to the sample 2 is one formed by sequentially laminating a chromium oxide film and a resist layer over a glass substrate. The XY stage 3 is configured so as to be movable in X and Y directions by stage driving means 46 to be described later. The position of movement of the XY stage 3 is detected by stage position detecting means 45 to be described later, based on the output of a laser interferometer 4.

An electron gun 5 corresponding to a source for the generation of an electron beam 6 is disposed above the XY stage 3. An illuminating lens 7, an S1 aperture (first aperture) 8, a projection lens 9, a shaping deflector 10, an S2 aperture (second aperture) 11, an objective lens 12 and an objective deflector 13 are disposed between the electron gun 5 and the XY stage 3.

The electron beam writing apparatus 100 is also equipped with a control section 20 and a memory or storage device 21 connected to the control section 20. The storage device 21 stores therein layout data, a position displacement amount distribution (called also "position displacement amount map") and optical system error distribution (called also "optical system error map") or the like to be described later. As the storage device 21, there may be mentioned, for example, a magnetic disk device, a magnetic tape device, an FD or a semiconductor memory or the like.

The control unit 20 is equipped with a preprocessing calculation unit 30. The preprocessing calculation unit 30 includes pattern density calculating means 31, dose distribution calculating means 32, exposure distribution calculating means 33, fogging electron amount distribution calculating means 34, charge amount distribution calculating means 35 and position displacement amount distribution calculating means 36.

The pattern density distribution calculating means 31 calculates distributions of pattern densities set every mesh region with respect to respective frames virtually divided or partitioned in mesh form with predetermined dimensions, based on graphic data contained in the layout data read from the storage device 21. The dose distribution calculating means 32 calculates a distribution of dose using a proximity effect correction equation of backscattered electrons to be described later. The exposure distribution calculating means 33 calculates an exposure distribution (irradiation amount distribution) of an electron beam applied to the sample, based on the pattern density distributions and the dose distribution. The fogging electron amount distribution calculating means 34 calculates a distribution of a fogging electron amount, based on the exposure distribution and a function descriptive of the spread of fogged electrons. The charge amount distribution calculating means 35 calculates a charge amount distribution of an irradiation region to which the electron beam is applied, and a charge amount distribution of a non-irradiation region to which no electron beam is applied, in accordance with a method to be described later. The position displacement amount distribution calculating means 36 calculates a distribution of a position displacement amount of the electron beam on the sample, based on the charge amount distribution calculated by the charge amount distribution calculating means 35.

The control section 20 has shot data generating means 41, grid matching control means 42, shaping deflector control means 43, objective deflector control means 44, the above-described stage position detecting means 45 and stage driving means 46 in addition to the preprocessing calculation unit 30.

The shot data generating means 41 creates or generates writing data, based on the layout data read from the storage device 21 and creates shot data, based on the writing data. The grid matching control means 42 controls the objective deflector control means 44 based on the position displacement amount distribution calculated by the position displacement amount distribution calculating means 36. The shaping deflector control means 43 controls the position of the shaping deflector 10 in such a manner that an S2 aperture image having a desired size and shape (rectangle or triangle) is obtained. The objective deflector control means 44 controls the position of the objective deflector 13 in such a manner that the electron beam 6 is applied onto a desired position of the sample 2.

A general writing operation of the electron beam writing apparatus 100 will next be explained.

The electron beam 6 emitted from the electron gun 5 is illuminated onto the entire S1 aperture 8 having a rectangular opening or aperture by the illuminating lens 7. The electron beam 6 of the S1 aperture image transmitted through the S1 aperture 8 is projected onto the S2 aperture 11 having a key-type opening by the projection lens 9. The position of the first aperture image on the S2 aperture 11 is deflected by the shaping deflector 10. Thus, the corresponding image is formed to a desired beam shape and size. The electron beam 6 of the S2 aperture image penetrated through the S2 aperture 11 is focused by the objective lens 12 and deflected by the objective deflector 13, which in turn is applied onto a desired position of the sample 2 placed on the XY stage 3.

Figure 2:
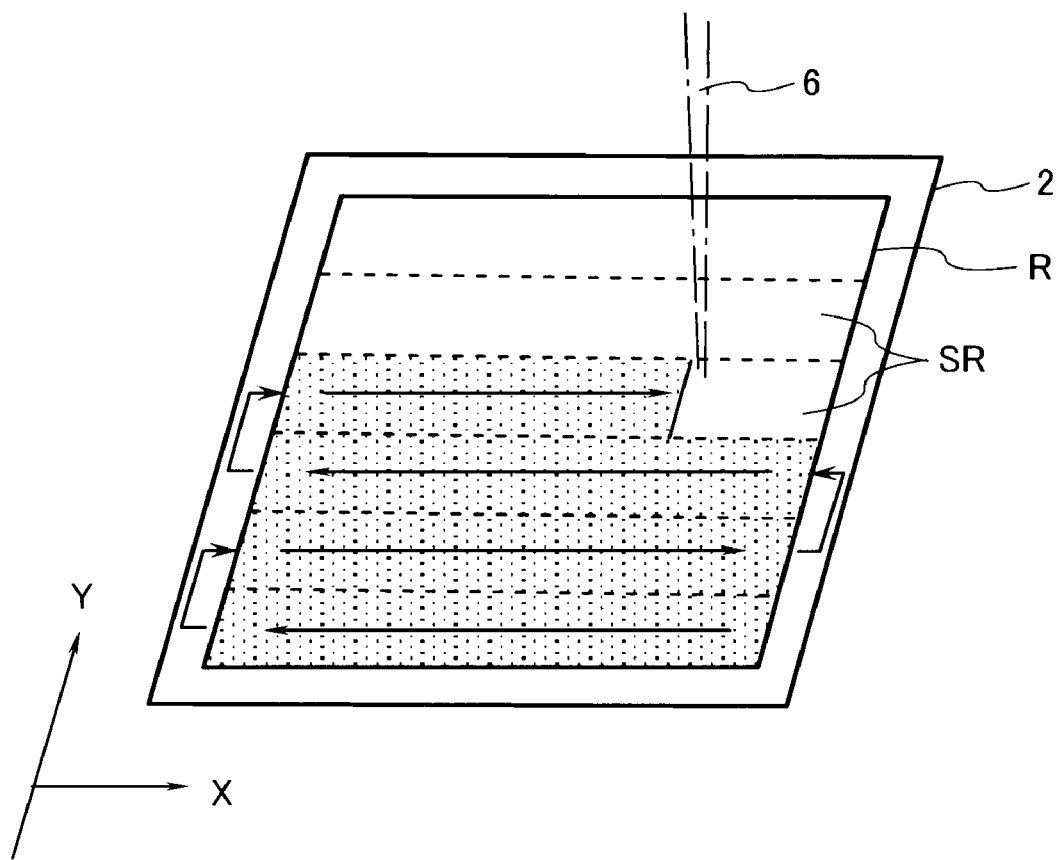
FIG. 2 is a diagram showing the direction of movement of a sample 2 at pattern writing.

The sample 2 is moved as shown in FIG. 2 with the continuous movement of the XY stage 3 upon pattern writing. FIG. 2 is a diagram showing the direction of movement of the sample 2 at the pattern writing. A writing region R of the sample 2 is virtually divided or partitioned into a plurality of strip-like stripe regions SR. The electron beam 6 is applied onto one stripe region SR in the X direction. That is, the shot position (irradiation region) of the electron beam 6 is also caused to follow the movement of the stage while the XY stage 3 is being continuously moved in the X direction. When the writing of one stripe region is completed, the XY stage 3 is step-fed in the Y direction. The electron beam 6 is applied onto the next stripe region in the X direction. At this time, the XY stage 3 is continuously moved in the opposite X direction.

Incidentally, it has been known that when the electron beam is applied onto the resist layer of the sample 2 as described above, the position of beam irradiation is shifted or displaced due to a resist charging effect.

Figure 3A:
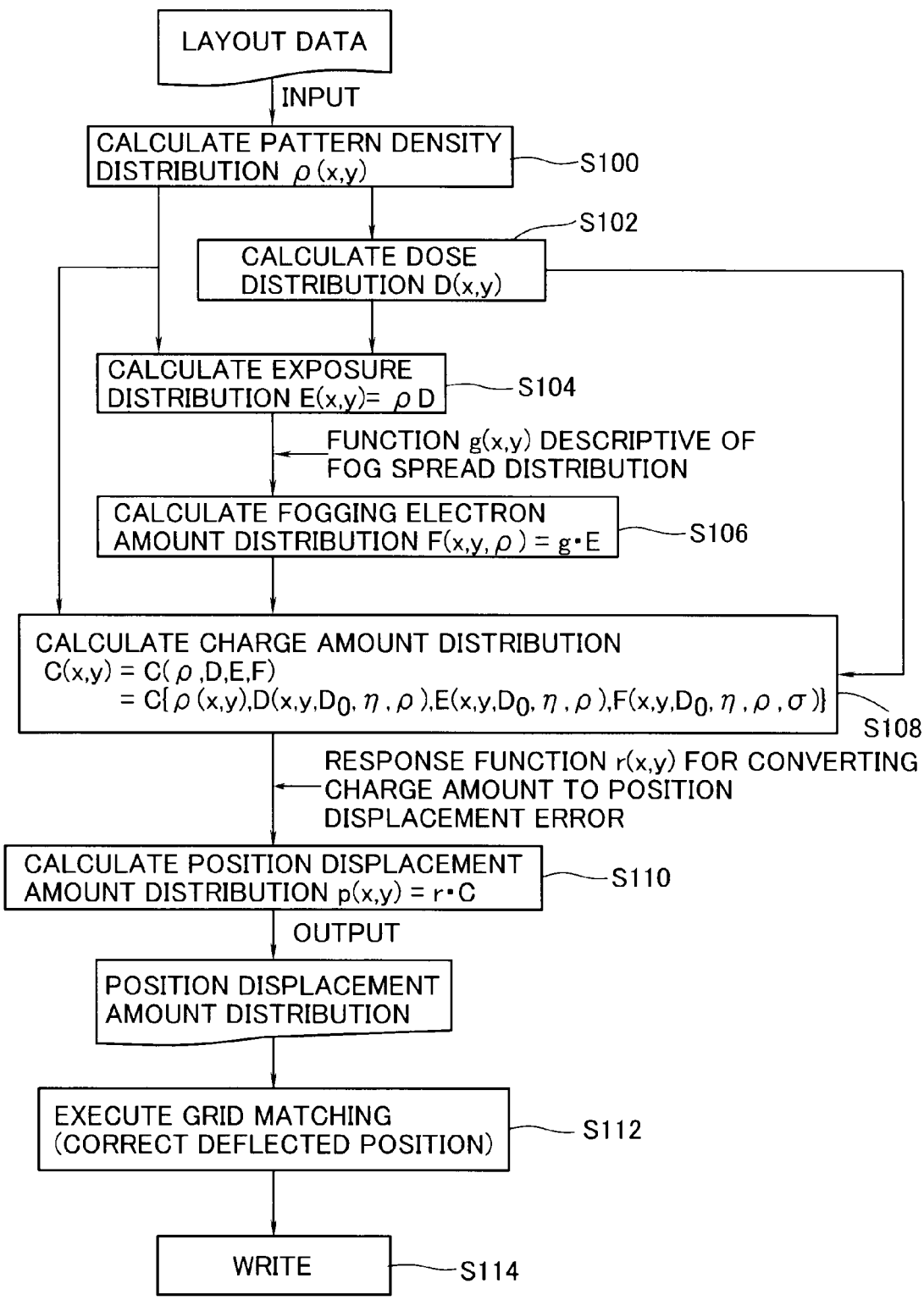
FIG. 3A is a flowchart for describing a writing method according to the embodiment of the present invention.

Thus, in the present embodiment, the writing of each pattern having considered a position displacement amount in the electron beam writing apparatus 100 is performed in accordance with such a flow as shown in FIG. 3A. FIG. 3A is a flow chart for describing a writing method according to the present embodiment.

According to the flow shown in FIG. 3A, the layout data stored in the storage device 21 is first read by the pattern density calculating means 31. Based on graphic data contained in the layout data, a pattern density is calculated with respect to each of frames (hereinafter called "mesh regions") virtually partitioned in mesh form with predetermined dimensions (grid dimensions) (Step S100). In this Step S100, a distribution $\rho(x,y)$ of pattern density for every mesh region is calculated.

Next, a distribution $D(x,y)$ of dose for every mesh region is calculated using the pattern density distribution $\rho(x,y)$ calculated in step S100 referred to above (Step S102). In this Step S102, the dose distribution $D(x,y)$ is calculated in accordance with the following proximity effect correction equation (1) of backscattered electrons:

$$D = D_0 \times \{(1+2\times\eta)/(1+2\times\eta\rho)\} \qquad (1)$$

(where $D_0$ indicates a reference dose, and $\eta$ indicates a backscattered ratio)

These reference dose $D_0$ and backscattered ratio $\eta$ are set by a user of the charged-particle beam writing apparatus 100. The backscattered ratio $\eta$ can be set in consideration of an acceleration voltage of the electron beam 6, a resist film thickness of the sample 2, the type of base substrate, process conditions (such as a PEB condition and a development condition), etc.

Next, an exposure distribution $E(x,y)$ (called also "exposure intensity distribution") for every mesh region is calculated by multiplying the pattern density distribution $\rho(x,y)$ calculated in above Step S100 and the dose distribution $D(x,y)$ calculated in above Step S102 by each other (Step S104).

And then a fogging electron amount distribution $F(x,y,\sigma)$ is calculated in accordance with a method to be described later (Step S106). A charge amount distribution $C(x,y)$ is calculated by the charge amount distribution calculating means 35 in accordance with a method to be described later (Step S108).

Incidentally, the pre-calculated pattern density distribution $\rho(x,y)$, dose distribution $D(x,y)$, exposure distribution $E(x,y)$, fogging electron amount distribution $F(x,y,\sigma)$ and charge amount distribution $C(x,y)$ are stored in the storage device 21. They may be read and obtained from the storage device 21 in steps respectively.

Next, a position displacement amount distribution $\rho(x,y)$ is calculated based on the charge amount distribution $C(x,y)$ calculated by the position displacement amount distribution calculating means 36 in above Step S108 (Step S110). In this Step S110, the position displacement amount distribution $p(x,y)$ is calculated by convolution integral of the charge amount distribution $C(x,y)$ and a response function $r(x,y)$ for converting the amount of charge to a position displacement error.

Then, grid matching is executed based on the position displacement amount distribution $p(x,y)$ calculated in above Step S110 (Step S112). After the control of the objective deflector 13 has been conducted in this Step S112 as described later, the electron beam 6 is applied onto the sample 2 to write a pattern (Step S114).

Figure 3B:
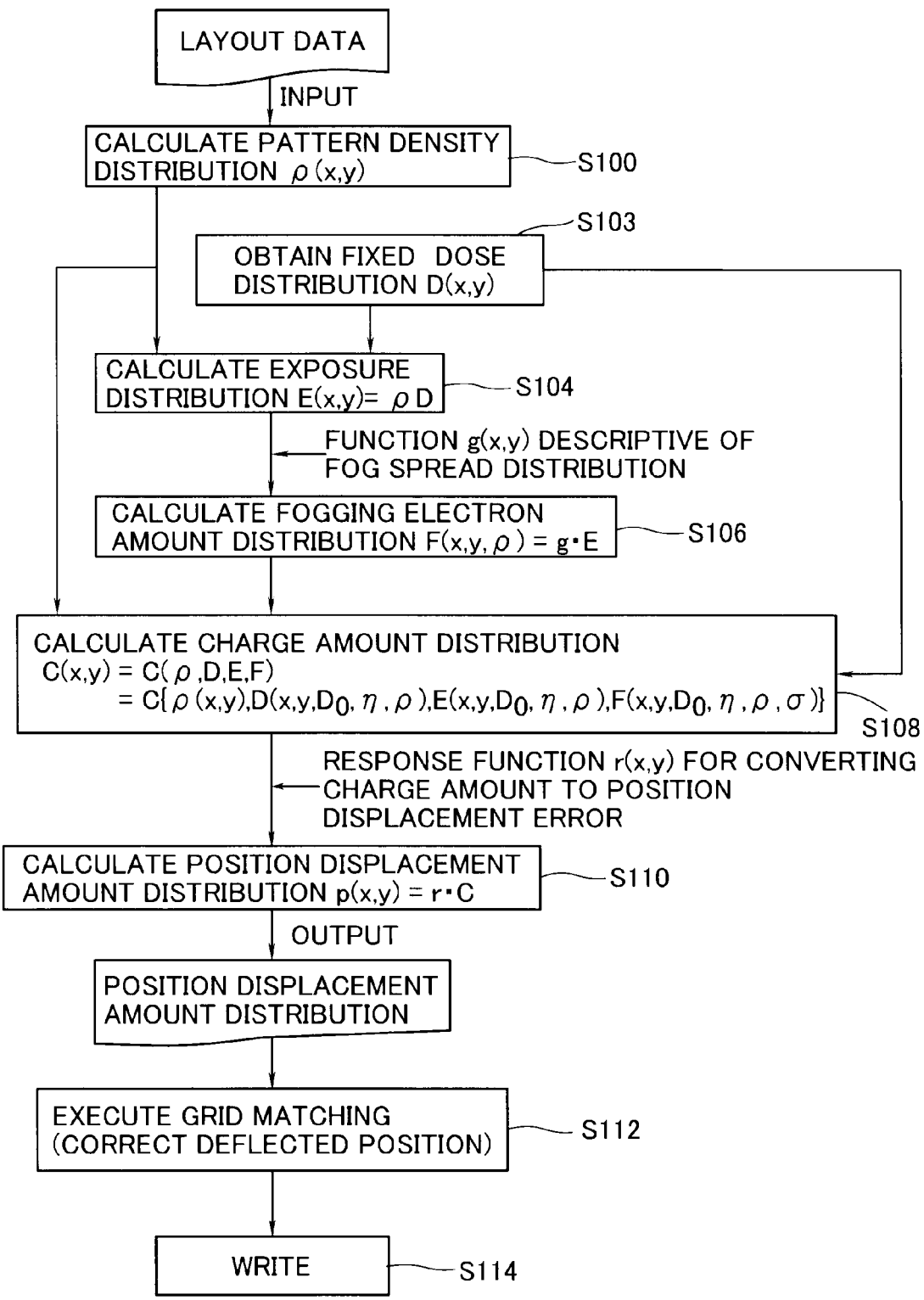
FIG. 3B is a flowchart for describing the writing method according to the embodiment of the present invention.

Incidentally, the writing may be conducted in accordance with a flow shown in FIG. 3B as an alternative to the flow shown in FIG. 3A. FIGS. 3A and 3B are different in Steps S102 and 103 and identical in other Steps. In step S102 of FIG. 3A, the dose distribution $D(x,y)$ is calculated based on the pattern density distribution $\rho(x,y)$, whereas in step S103 of FIG. 3B, the fixed dose distribution $D(x,y)$ is obtained without reference to the pattern density distribution $\rho(x,y)$. In step S104 of FIG. 3B, the fixed dose distribution $D(x,y)$ obtained in step S103 and the pattern density distribution $\rho(x,y)$ calculated in step S100 are multiplied by each other to determine the exposure distribution $E(x,y)$.

Figure 4:
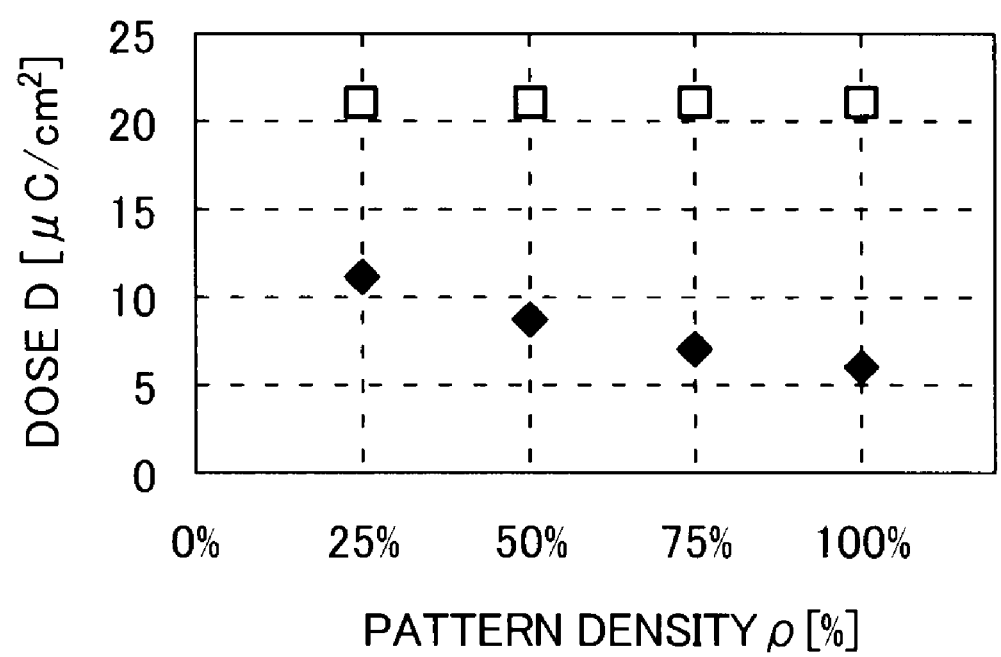
FIG. 4 is a diagram showing where the dose is changed according to the pattern density and where the dose is fixed regardless of the pattern density.

Thus, the exposure distribution $E(x,y)$ may be calculated using the fixed dose distribution $D(x,y)$ without depending on the pattern density distribution $\rho(x,y)$. In FIG. 4, ♦ indicates a dose that changes according to a pattern density $\rho$, and □ indicates a dose (21 $\mu C/cm^2$) fixed regardless of the pattern density.

The flow of the grid matching executed in above Step S112 will next be explained with reference to FIG. 5.

Figure 5:
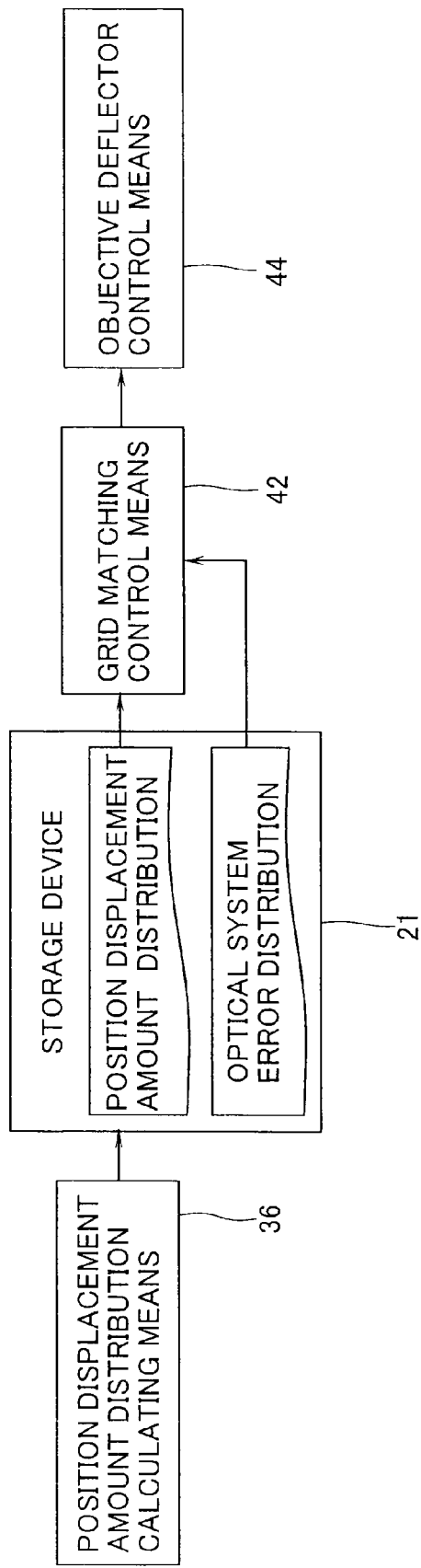
FIG. 5 is a schematic diagram for describing the flow of grid matching.

As shown in FIG. 5, the position displacement amount distribution calculated by the position displacement amount distribution calculating means 36 is stored in the storage device 21. Thereafter, the position displacement amount distribution stored in the storage device 21 and the optical system error distribution created in advance and stored in the storage device 21 are read by the grid matching control means 42. The grid matching control means 42 combines each data of the position displacement amount distribution for every mesh and each data of the optical system error distribution for every mesh and outputs the combined data to the objective deflector control means 44. The objective deflector control means 44 controls the position of deflection of the electron beam 6, based on the inputted data. That is, the position of the objective deflector 13 is controlled to a correction position where the position displacement amount distribution and the optical system error distribution have been taken into consideration.

In order to improve the accuracy of placement of each pattern on the sample, there is a need to perform grid matching with satisfactory accuracy. To this end, there is a need to calculate the position displacement amount distribution $p(x,y)$ (called also "position shift amount distribution") with high accuracy.

A method for calculating the position displacement amount distribution $p(x,y)$ will next be explained.

A position displacement amount distribution calculating method according to a comparative example with respect to the present embodiment will first be described with reference to FIG. 6.

Figure 7:
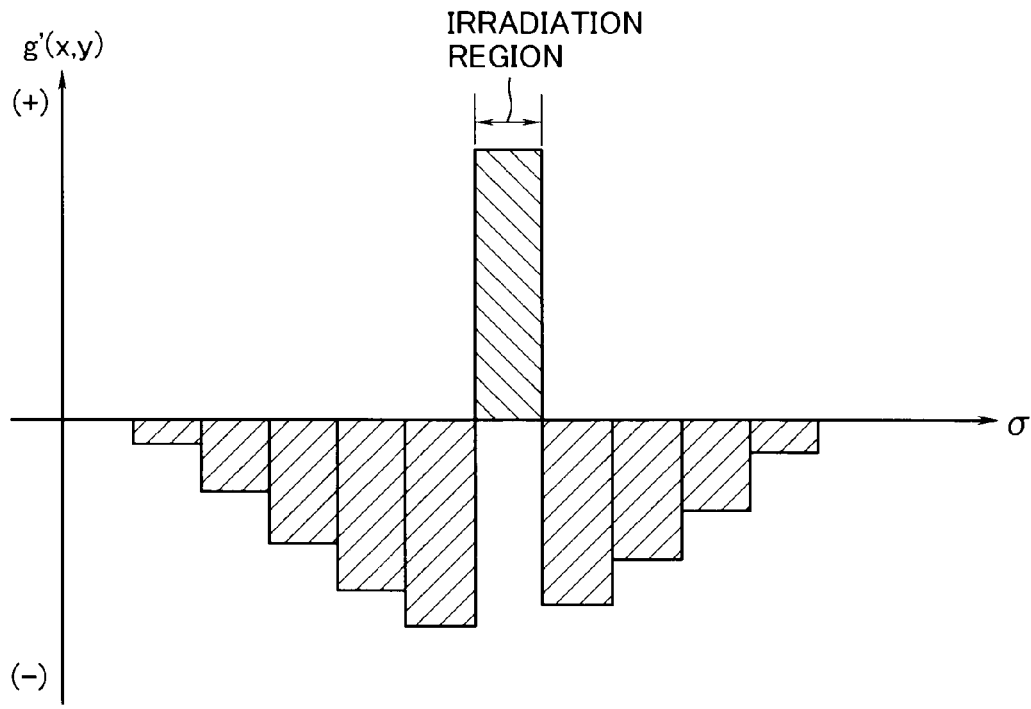
FIG. 7 is a diagram showing a function $g'(x,y)$ descriptive of a spread distribution.

Assumes that a function $g'(x,y)$ descriptive of a spread distribution of electrons (charge amount) exists with respect to a given exposure distribution $E(x,y)$ in the present comparative example. As this function $g'(x,y)$, a model of a Gaussian distribution positively charged in an electron beam irradiation region and negatively charged in a non-irradiation region as shown in FIG. 7, for example, can be used. A charge amount distribution $C(x,y)$ is determined by convolution integral of the exposure distribution $E(x,y)$ and the spread distribution function $g'(x,y)$.

Next imagine a response function $r(x,y)$ for converting the charge amount distribution $C(x,y)$ to the position displacement amount distribution $p(x,y)$. Since the position displacement of the beam can be expressed as a function of distance between a beam irradiation position $(x,y)$ and a charging position $(x',y')$ here, the response function can be described like "$r(x-x',y-y')$".

Figure 8:
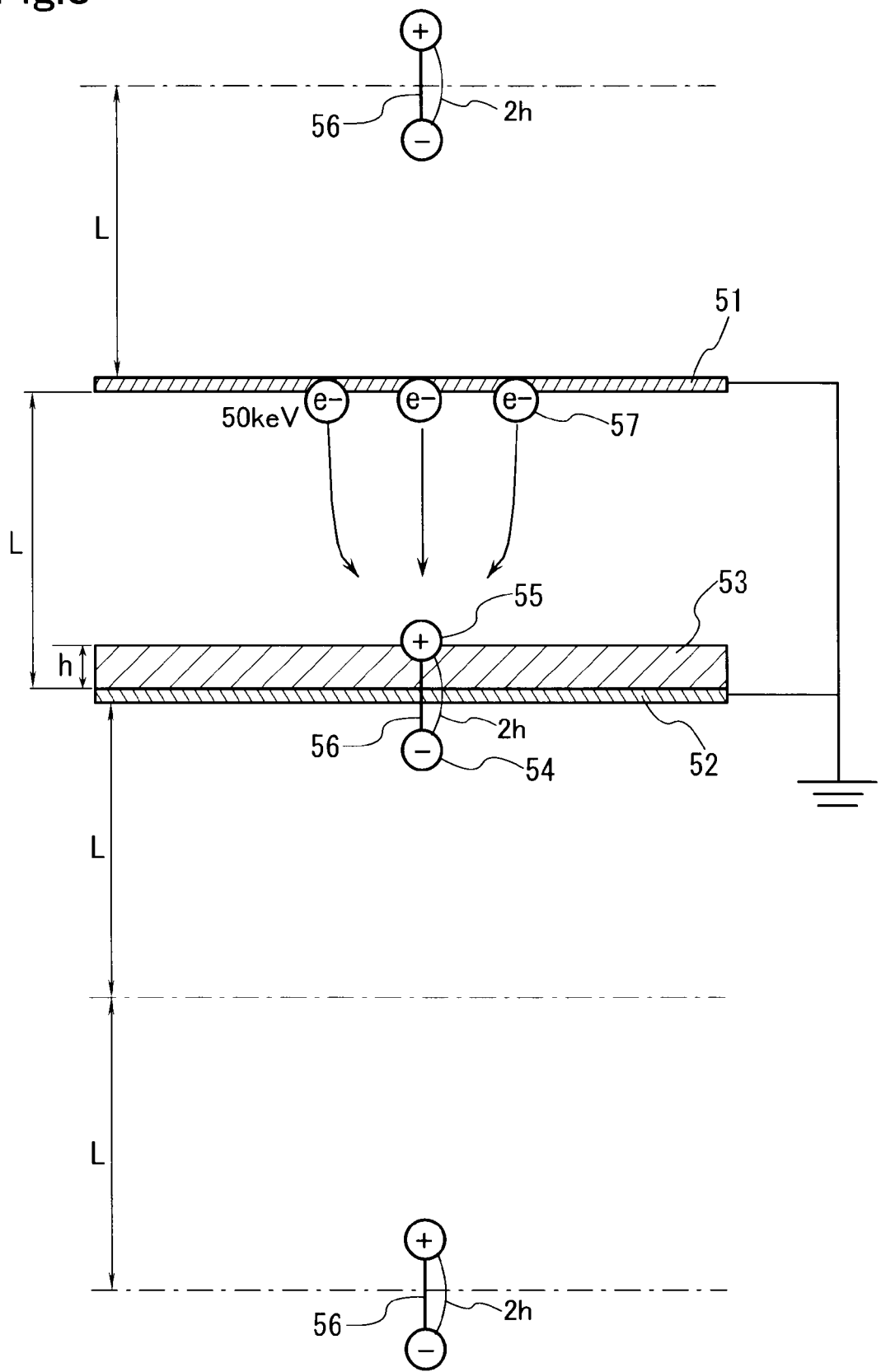
FIG. 8 is a diagram illustrating a model assumed to calculate a response function.

FIG. 8 is a diagram showing a model assumed to calculate the response function $r(x,y)$. As shown in FIG. 8, two parallel flat plates 51 and 52 both earthed to 0 V are disposed with being spaced a distance L away from each other. The upper flat plate 51 corresponds to a wall surface of the writing section 1, specifically, a block of the objective lens 12, and the lower flat plate 52 corresponds to a chrome layer of a photomask. The two flat plates 51 and 52 are considered as complete conductors. A point charge source 55 is disposed at the surface of a resist 53 having a thickness h. Since the conductive chrome layer 52 can be assumed to be a mirror upon static potential calculations, a mirror image charge 54 is positioned below the chrome layer 52 by an equal distance "−h". Actual electrostatic charge 55 and mirror charge 54 act as a dipole 56 in pairs. Since the conductive upper flat plate 51 can also be taken as a mirror, one pair of an infinite number of dipoles 56 is disposed at a pitch of "2L". Upon actual calculations, the number of the dipoles 56 is cut off to a given actual limit. A trajectory of each electron 57 accelerated at 50 keV is calculated by solving a motion equation. Thus, the final shift or displacement of the position of each electron at the time that it reaches the surface of the resist 53, is obtained as a beam position error relative to a given incident position.

According to this assumption, the position displacement amount distribution $p(x,y)$ is determined by convolution integral of the response function $r(x,y)$ and the charge amount distribution C(x,y). That is, the position displacement amount distribution p(x,y) is determined by convolution integral of the response function r(x,y), the charge distribution function g'(x,y) and the exposure distribution E(x,y).

Figure 6:
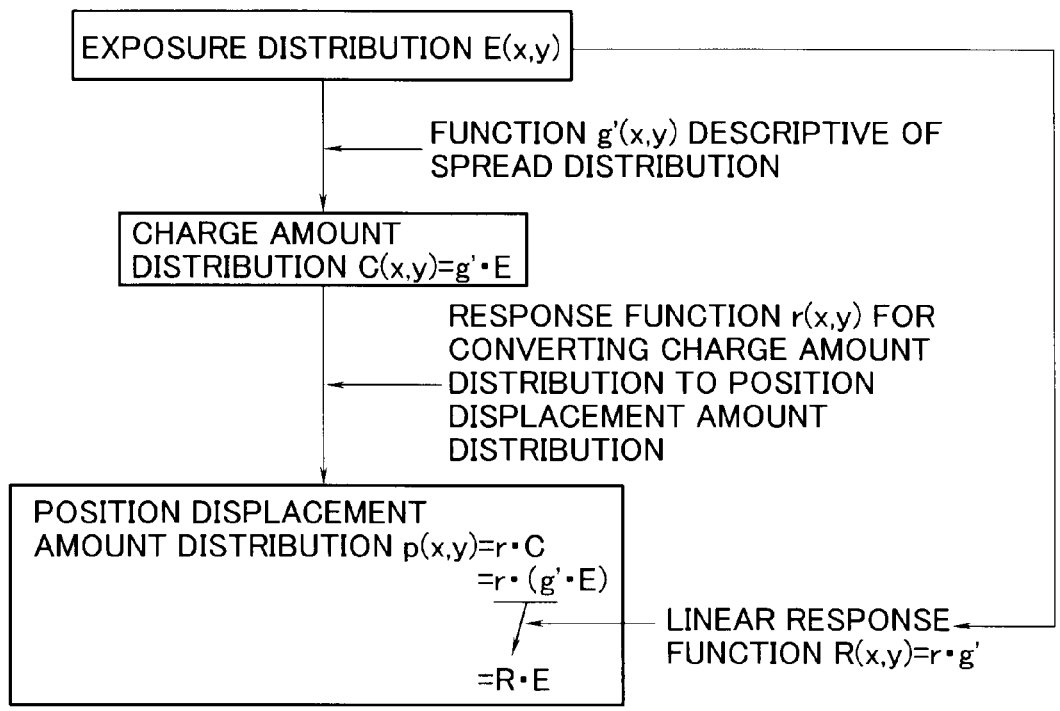
FIG. 6 is a diagram for describing a method of calculating a position displacement amount distribution according to a comparative example relative to the embodiment of the present invention.

Assuming now that a linear proportional relationship is established between the exposure distribution E(x,y) and the position displacement amount distribution p(x,y), the position displacement amount distribution p(x,y) can be determined by convolution integral of the linear response function R(x,y) and the exposure distribution E(x,y) as shown in FIG. 6. Namely, according to the present comparative example, the calculation of the charge amount distribution C(x,y) can be skipped because the position displacement amount distribution p(x,y) is directly introduced from the exposure distribution E(x,y) via the linear response function R(x,y).

According to the discussions of the present inventors, however, it has been found out that the position displacement amount distribution p(x,y) determined by the comparative example is different from the results of experiments.

Figure 9A:
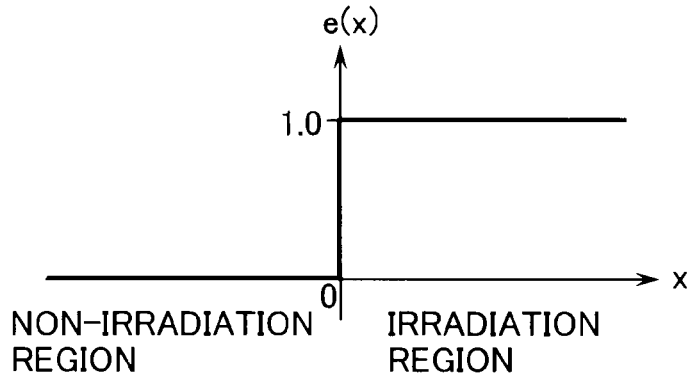
FIG. 9A is a diagram showing a linear step function given upon verification of the comparative example.
Figure 9B:
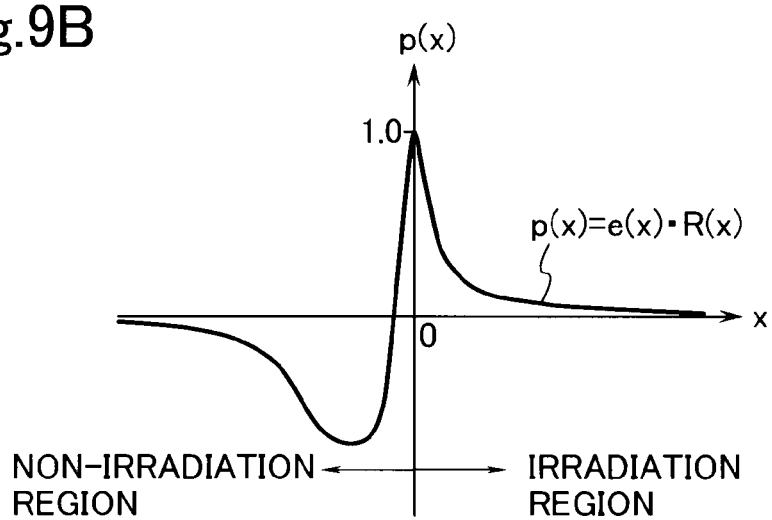
FIG. 9B is a diagram illustrating a position displacement amount distribution $p(x)$ determined by the comparative example.
Figure 10:
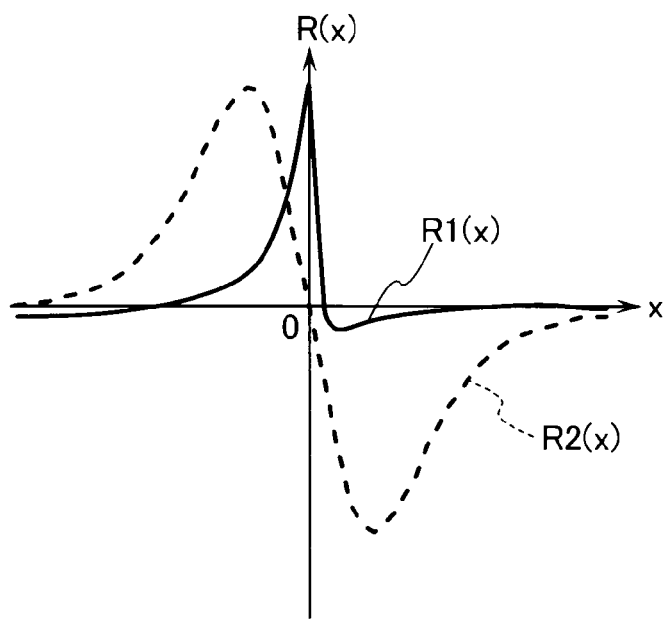
FIG. 10 is a diagram showing a linear response function $R1(x)$ determined upon verification of the comparative example and a desired response function $R2(x)$.

The method for calculating the position displacement amount distribution according to the comparative example will be verified with reference to FIGS. 9A, 9B and 10.

Upon the verification of the position displacement amount distribution calculating method according to the comparative example, a linear step function was first given as an exposure distribution e(x) as shown in FIG. 9A. According to the present function, the amount of irradiation in an irradiation region is 1 and the amount of irradiation in a non-irradiation region is 0.

In the comparative example, the position displacement amount distribution p(x) is determined by convolution integral of the exposure distribution e(x) and the linear response function R(x) as shown in FIG. 9B. Thus, the linear response function R(x) can be determined by differentiation of the position displacement amount distribution p(x). It has been understood that as shown in FIG. 10, the linear response function $R1(x)$ determined by differentiation of the position displacement amount distribution p(x) is different from a desired response function $R2(x)$ and is rotationally unsymmetric at the boundary between the irradiation and non-irradiation regions. It has thus been understood that the assumption of the linear proportional relationship in the comparative example is not established.

Therefore, the present inventors have found out a new model for calculating a position displacement amount distribution without using the linear response function R(x).

Figure 11:
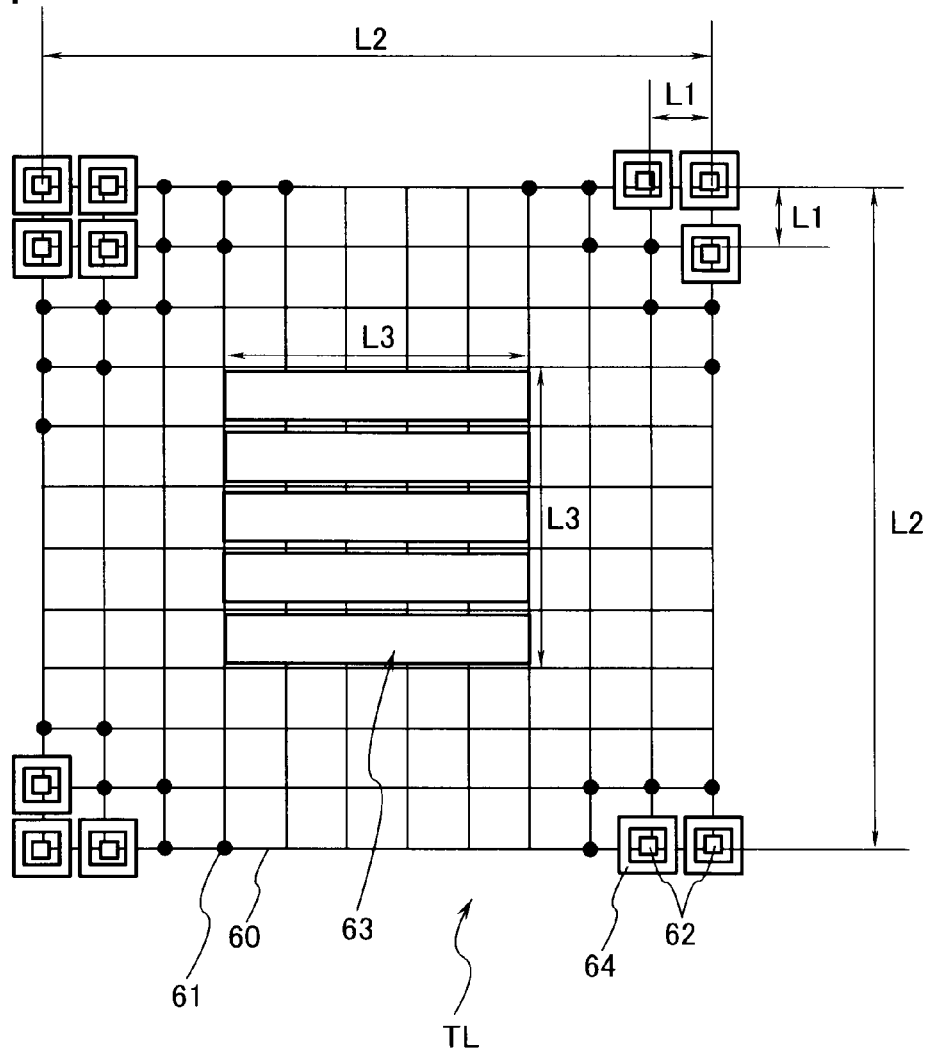
FIG. 11 is a diagram depicting a test layout for measuring a resist charging effect.

The present inventors have first measured a resist charging effect. FIG. 11 is a diagram showing a test layout used to measure the resist charging effect. Incidentally, the contents of respective parts are shown on a changed scale to make it easier to understand the contents of the respective parts.

The test layout TL shown in FIG. 11 is obtained by writing first box arrays 62 on a grid (81×81 grids) 60, whose pitch L1 is 1 mm and whose length L2 of one side is 80 mm, at the amount of irradiation of 12 µC/cm²; then writing an irradiation pad 63, whose length L3 of one side is 40 mm and whose pattern density is 100%, at the center of the layout TL at the amount of irradiation of 21 µC/cm²; and further writing second box arrays 64 on the same grid 60 as the first box arrays 62 at the amount of irradiation of 12 µC/cm².

Figure 12:
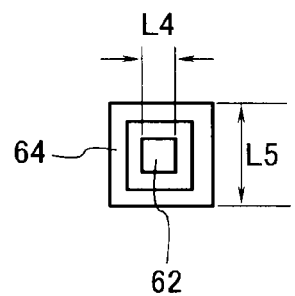
FIG. 12 is a diagram showing first and second box arrays in enlarged form.

As shown in enlarged form in FIG. 12, the first box array 62 is of a square pattern whose length L4 of one side is 4 µm, for example. The second box array 64 is of a frame-shaped pattern whose length L5 of one side is 14 µm and whose center has been cut off in a size larger than that of the first box array 62.

Here, the pattern density of the irradiation pad 63 was changed like 100%, 75%, 50% and 25% to form the test layouts TL respectively. FIGS. 13A through 13D respectively show irradiation pads 63A, 63B, 63C and 63D whose pattern densities are 100%, 75%, 50% and 25% respectively.

Figure 13A:
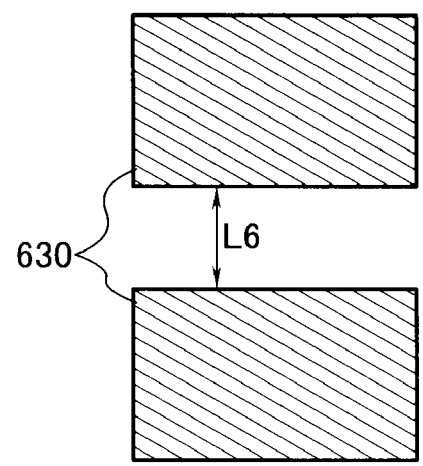
FIG. 13A is a diagram illustrating an irradiation pad whose pattern density is 100%.
Figure 13B:
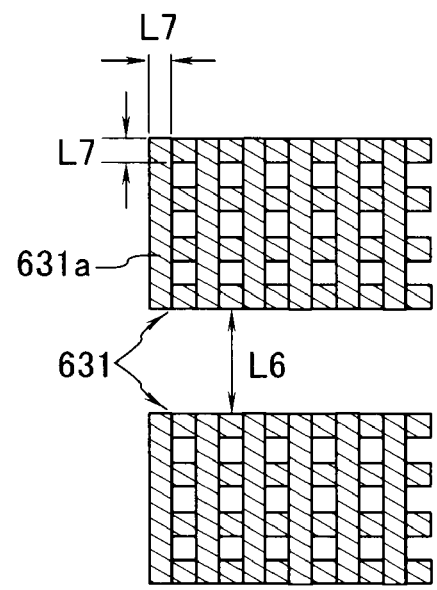
FIG. 13B is a diagram showing an irradiation pad whose pattern density is 75%.
Figure 13C:
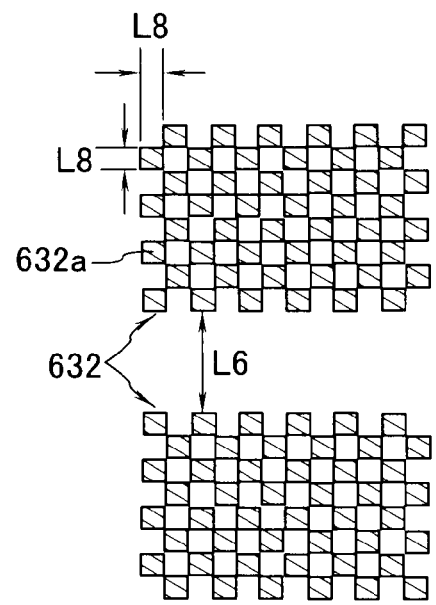
FIG. 13C is a diagram illustrating an irradiation pad whose pattern density is 50%.
Figure 13D:
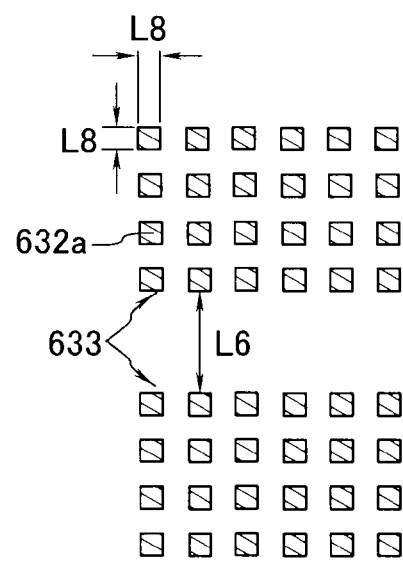
FIG. 13D is a diagram depicting an irradiation pad whose pattern density is 25%.

The irradiation pad 63A shown in FIG. 13A is comprised of a plurality of rectangular patterns 630 spaced away from one another by a distance L6. The distance L6 is 20 µm, for example. The irradiation pad 63B shown in FIG. 13B is comprised of a plurality of patterns 631 spaced away from one another by the distance L6. Each of the patterns 631 is one formed by causing a plurality of line patterns 631a whose length L7 of short side is 4 µm, for example to intersect one another. The irradiation pad 63C shown in FIG. 13C is comprised of a plurality of patterns 632 spaced away from one another by the distance L6. Each of the patterns 632 has a plurality of square patterns 632a. The length L8 of one side of the pattern 632a is 4 µm, for example. The irradiation pad 63D shown in FIG. 13D is comprised of a plurality of patterns 633 spaced away from one another by the distance L6. Each of the patterns 633 is one in which the number of the patterns 632a constituting the pattern 632 is reduced to half.

The positions of the written first and second box arrays 62 and 64 were respectively measured using a resist image measuring method. A position displacement of the irradiation pad 63 due to a charging effect can be measured by subtracting the position of each first box array 62 from the position of each second box array 64. In the present embodiment, the position displacements of the two box arrays 62 and 64 written on the 2 mm-pitched 41×41 grids of the 81×81 grids shown in FIG. 11 were measured to shorten their measurement times.

Here, in the present embodiment, the pattern density is changed to 100%, 75%, 50% and 25% as described above with respect to four types of chemical amplification resists A through D where as shown in FIG. 4, the dose D is fixed (21 µC/cm²) regardless of the pattern density ρ and the dose D is changed according to the pattern density ρ, thereby forming test layouts TL respectively. Then, position displacements thereof were measured for every test layout.

Figure 14A:
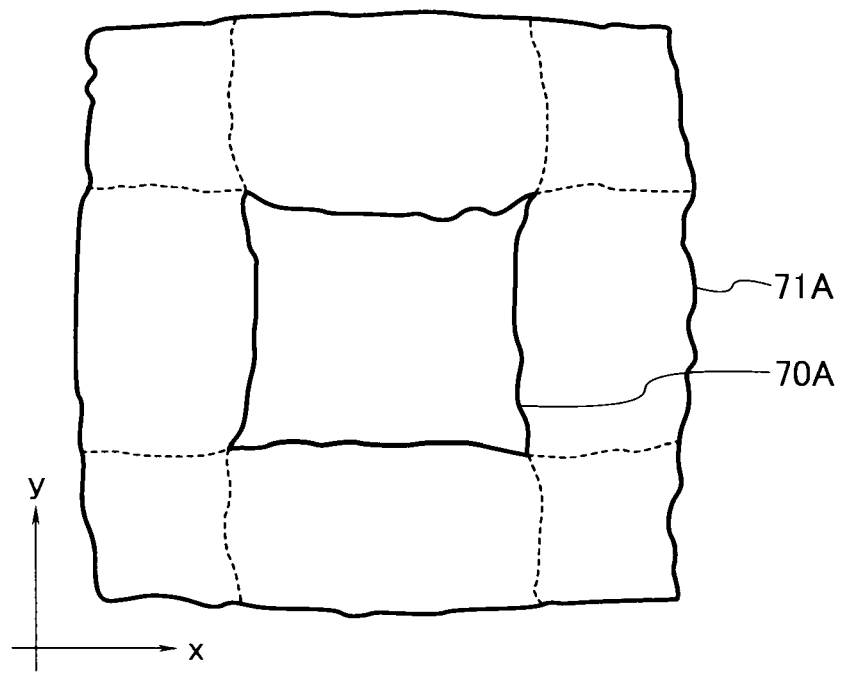
FIG. 14A is a schematic diagram showing a measured result of position displacement of a chemical amplification resist A.
Figure 14B:
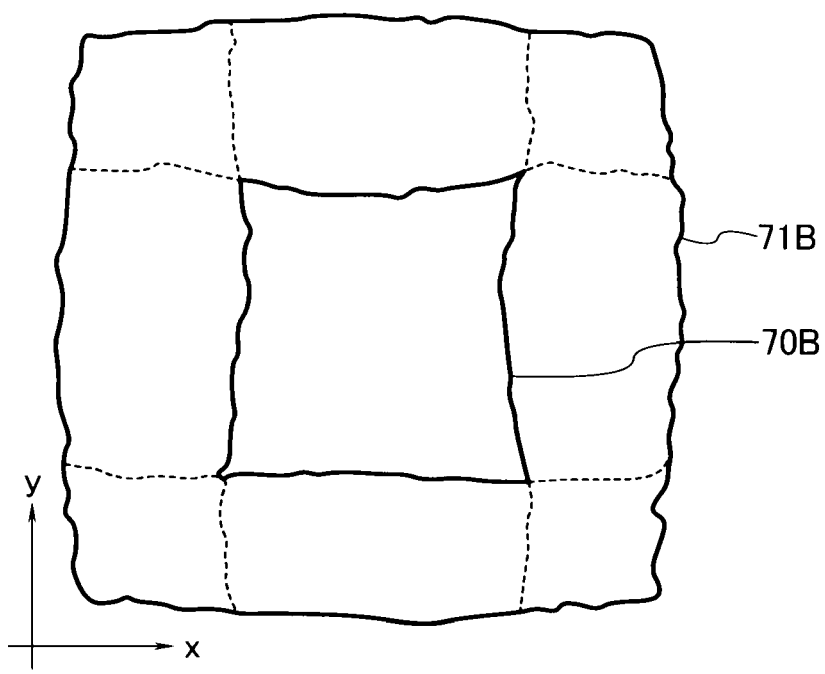
FIG. 14B is a schematic diagram illustrating a measured result of position displacement of a chemical amplification resist B.
Figure 14C:
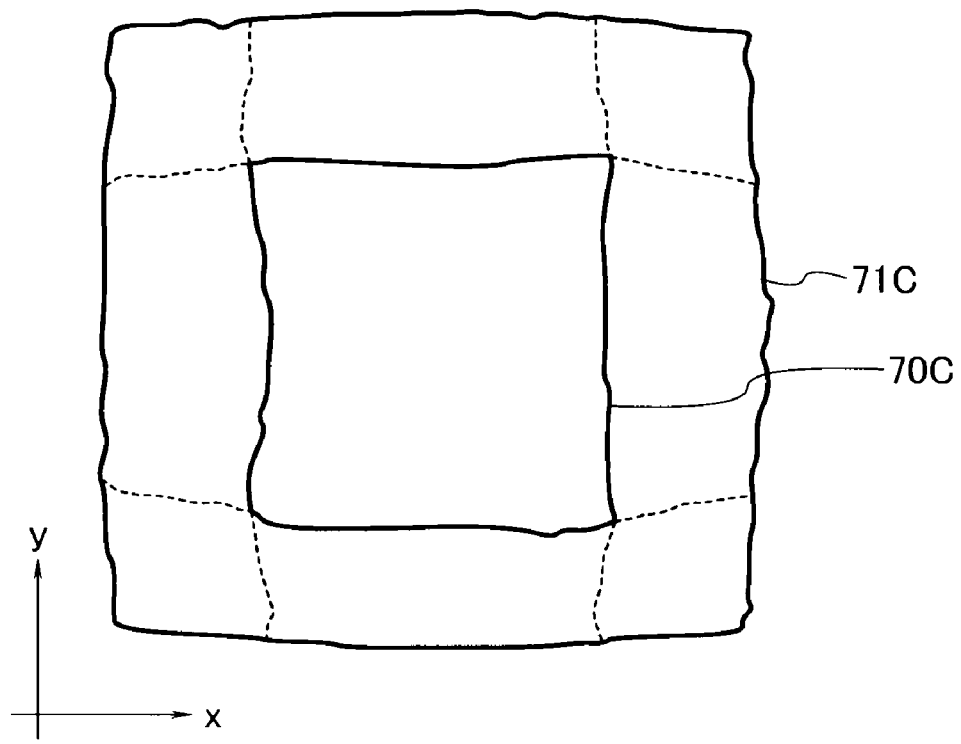
FIG. 14C is a schematic diagram illustrating a measured result of position displacement of a chemical amplification resist C.

Measured results of position displacements due to charging effects are shown in FIGS. 14A through 14C. FIGS. 14A through 14C respectively schematically show a position displacement in the vicinity of a boundary between irradiation and non-irradiation regions and a position displacement in the outer periphery of the non-irradiation region with respect to three types of resists A, B and C where a dose D is fixed.

As shown in FIGS. 14A through 14C, similar position displacements 71A, 71B and 71C occur so as to expand outside in the outer periphery of the non-irradiation region even with respect to any of the three types of resists A, B and C.

On the other hand, both position displacements 70A and 70B occur toward the inside of the irradiation region in the neighborhood of the boundary between the irradiation region and the non-irradiation region in the case of the resists A and B as shown in FIGS. 14A and 14B. These position displacements 70A and 70B differ from each other in that the position displacement 70A in the case of the resist A is approximately symmetric from right to left and up and down, whereas the position displacement 70B in the case of the resist B is asymmetric up and down. Unlike these resists A and B, the position displacement 70C in the case of the resist C shows little position displacement toward the inside of the irradiation region as shown in FIG. 14C.

Figure 15A:
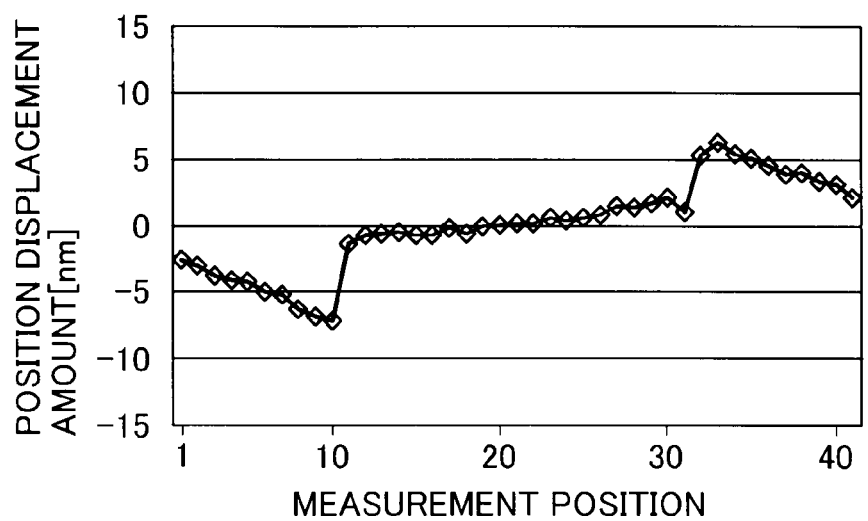
FIG. 15A is a plotted diagram of position displacement amounts in an X direction in the case of a resist A and a pattern density of 25%.
Figure 15B:
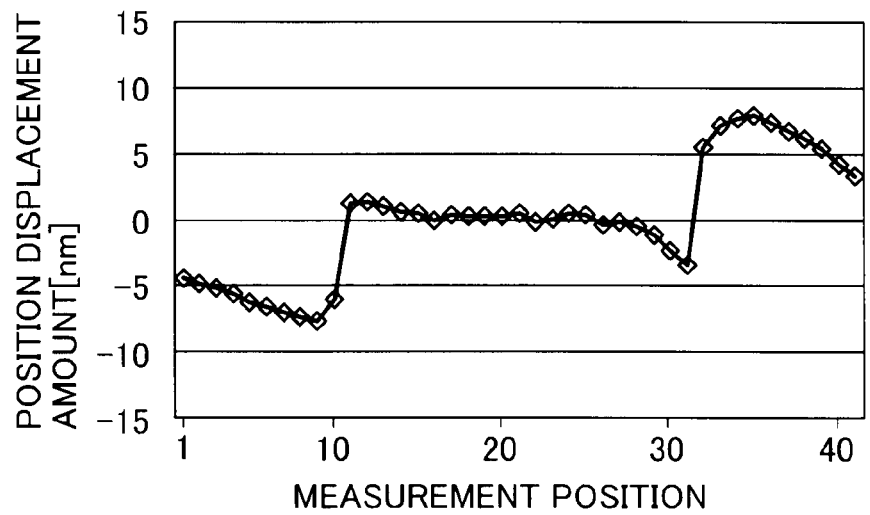
FIG. 15B is a plotted diagram of position displacement amounts in the X direction in the case of the resist A and a pattern density of 50%.
Figure 15C:
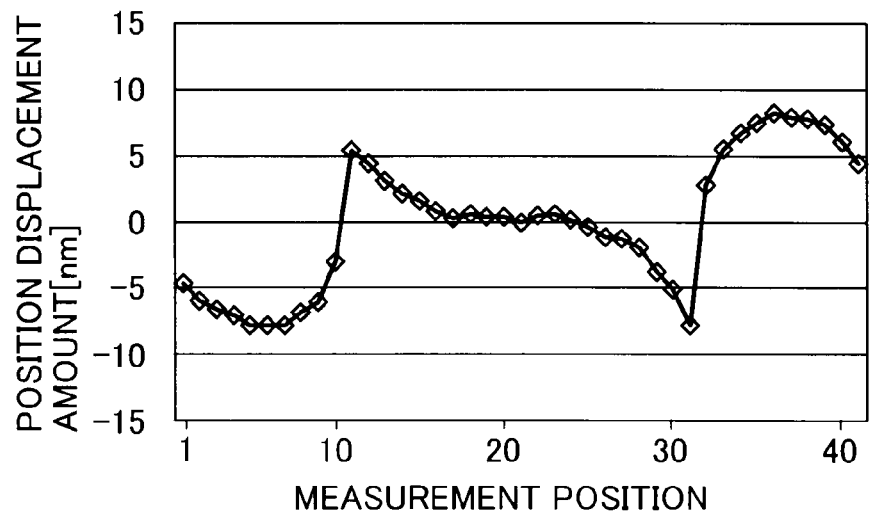
FIG. 15C is a plotted diagram of position displacement amounts in the X direction in the case of the resist A and a pattern density of 75%.
Figure 15D:
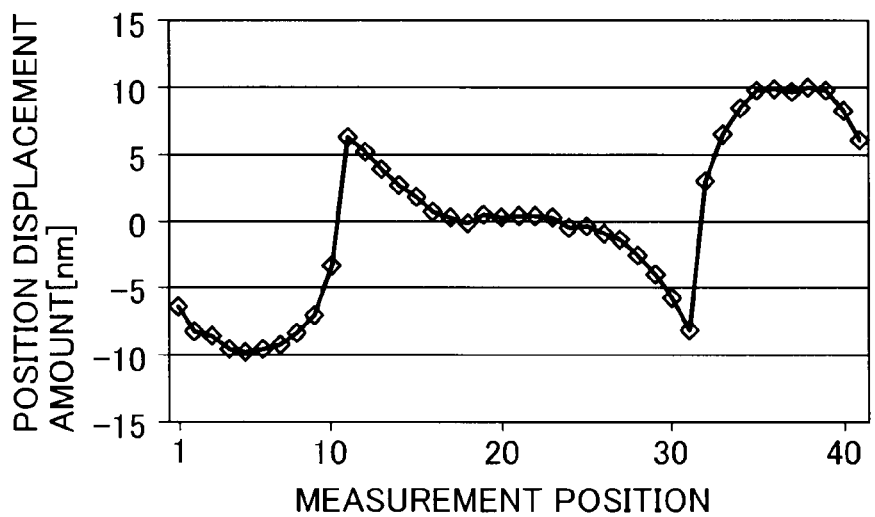
FIG. 15D is a plotted diagram of position displacement amounts in the X direction in the case of the resist A and a pattern density of 100%.
Figure 16A:
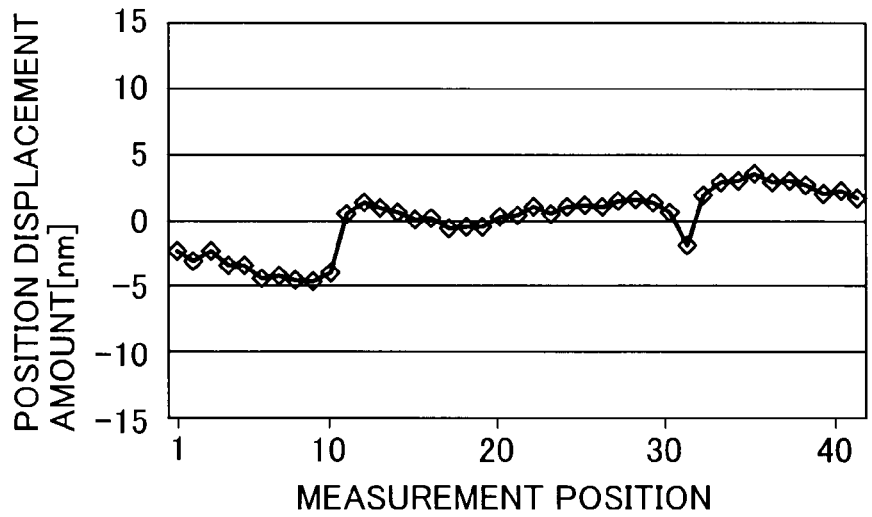
FIG. 16A is a plotted diagram of position displacement amounts in an X direction in the case of a resist B and a pattern density of 25%.
Figure 16B:
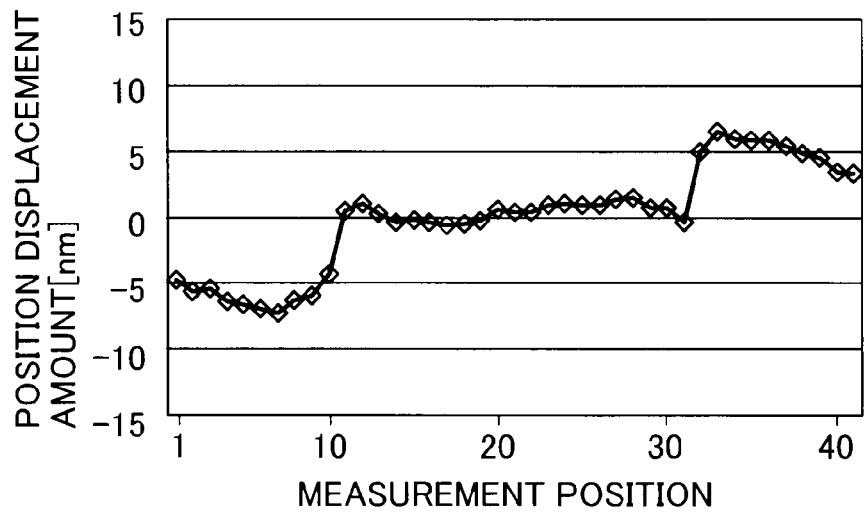
FIG. 16B is a plotted diagram of position displacement amounts in the X direction in the case of the resist B and a pattern density of 50%.
Figure 16C:
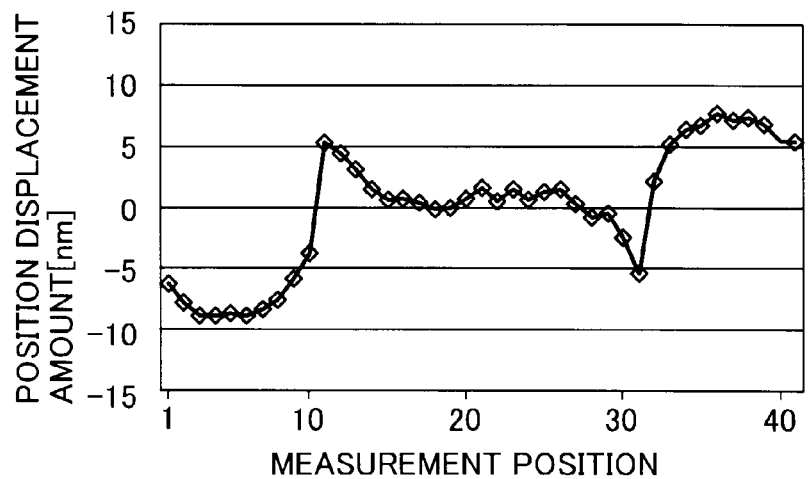
FIG. 16C is a plotted diagram of position displacement amounts in the X direction in the case of the resist B and a pattern density of 75%.
Figure 16D:
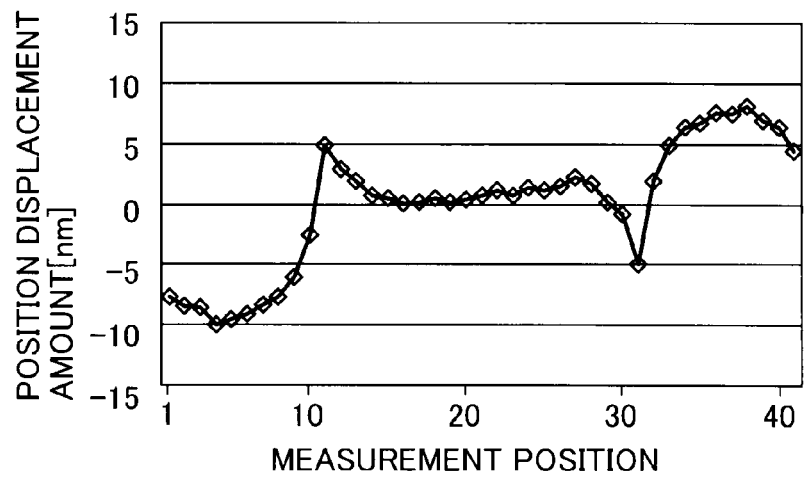
FIG. 16D is a plotted diagram of position displacement amounts in the X direction in the case of the resist B and a pattern density of 100%.
Figure 17A:
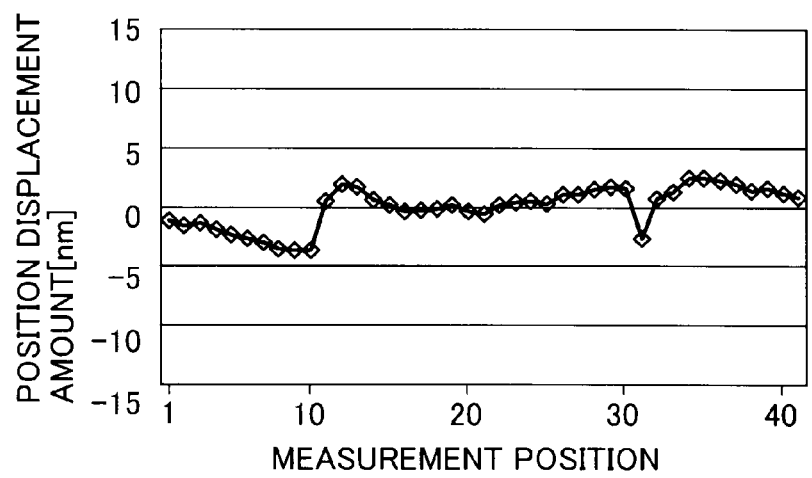
FIG. 17A is a plotted diagram of position displacement amounts in an X direction in the case of a resist C and a pattern density of 25%.
Figure 17B:
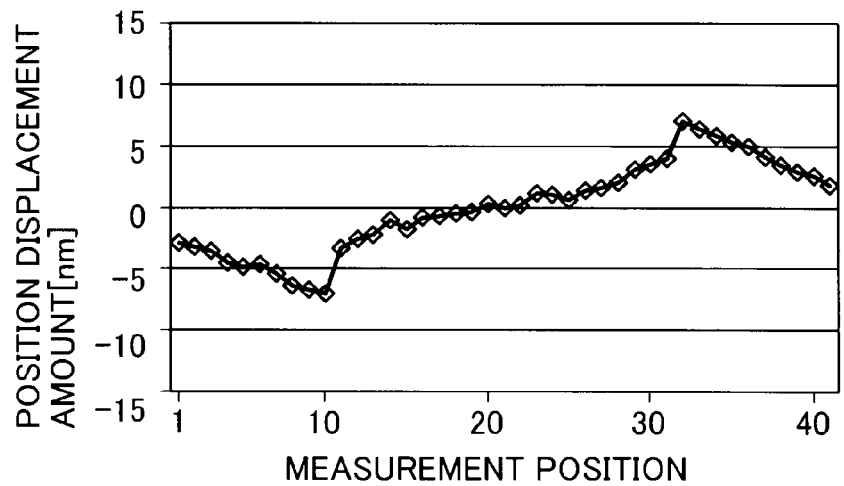
FIG. 17B is a plotted diagram of position displacement amounts in the X direction in the case of the resist C and a pattern density of 50%.
Figure 17C:
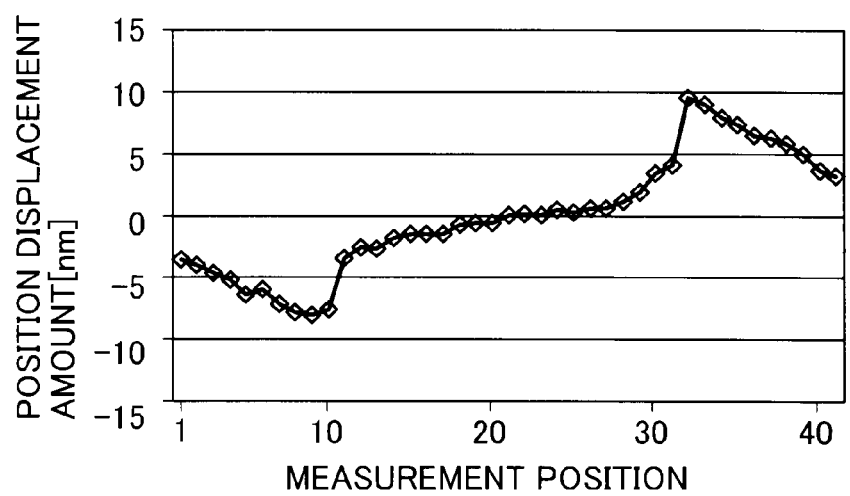
FIG. 17C is a plotted diagram of position displacement amounts in the X direction in the case of the resist C and a pattern density of 75%.
Figure 17D:
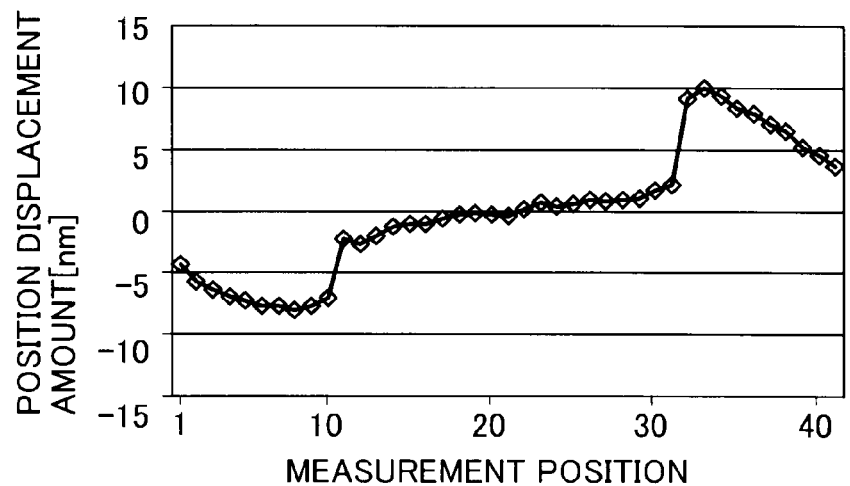
FIG. 17D is a plotted diagram of position displacement amounts in the X direction in the case of the resist C and a pattern density of 100%.

FIGS. 15A through 15D, FIGS. 16A through 16D and FIGS. 17A through 17D are respectively diagrams showing X-direction position displacements each related or corresponding to the average of 11 rows where the dose is constant (21 μC/cm²) without depending on the pattern density with respect to three types of resists A, B and C. These FIGS. 15A through 17D are respectively ones in which X-direction position displacement amounts each corresponding to the average of 11 rows equivalent to thirty-first row through fifty-first row in every other pitch of 81×81 grids are plotted. FIGS. 15A, 16A and 17A respectively show position displacement amounts where the pattern density of the irradiation pad 63 is 25%, FIGS. 15B, 16B and 17B respectively show position displacement amounts where the pattern density of the irradiation pad 63 is 50%. FIGS. 15C, 16C and 17C respectively show position displacement amounts where the pattern density of the irradiation pad 63 is 75%, and FIGS. 15D, 16D and 17D respectively show position displacement amounts where the pattern density of the irradiation pad 63 is 100%.

According to the results shown in FIGS. 15A through 17D, it has been understood that each of the position displacement amounts increases as the pattern density becomes higher, and the position displacement amounts are different from one another where the type of resist differs even in the same pattern density.

Figure 18:
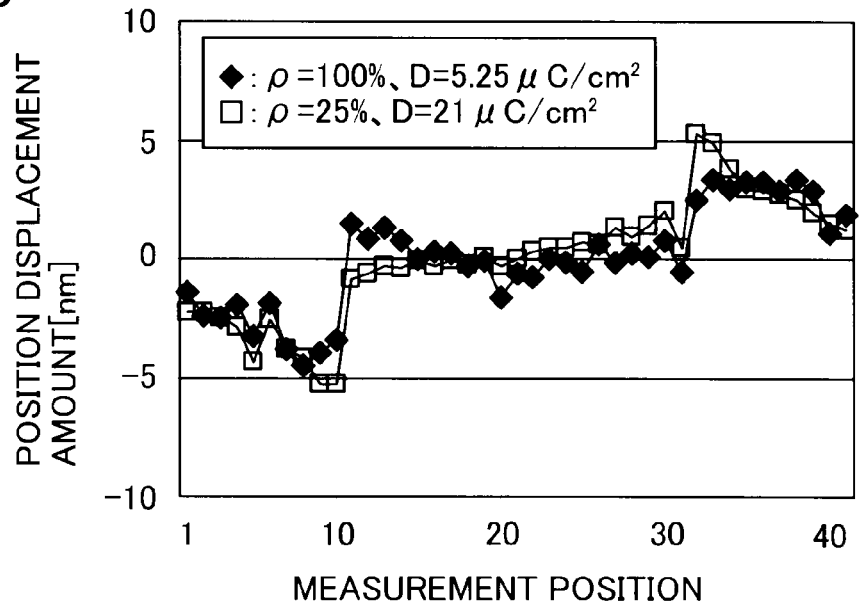
FIG. 18 is a diagram showing position displacement amounts of a resist A where a pattern density $\rho$ is 25% and a dose D is 21 $\mu C/cm^2$ and position displacement amounts thereof where the pattern density $\rho$ is 100% and the dose D is 5.25 $\mu C/cm^2$.

On the other hand, FIG. 18 shows together the X-direction position displacement amount where the pattern density ρ is 25% and the dose D is fixed to 21 μC/cm² in the case of the resist A, and the X-direction position displacement amount where the pattern density ρ is 100% and the dose D is 5.25 μC/cm² in the case of the resist A. Since the exposure E is determined by multiplying the pattern density ρ and the dose D by each other as described above here, these two cases are identical in exposure E. Therefore, these two cases are considered to be equal in position displacement amount, but differ from each other in position displacement amount as shown in FIG. 18. This is considered to occur due to the difference between the case in which the dose D is fixed to 21 μC/cm² without depending on the pattern density ρ and the case in which the dose is changed according to the pattern density ρ (5.25 μC/cm²). Thus, there is a need to enhance the accuracy of calculation of the exposure distribution for the purpose of calculating the position displacement amount distribution with satisfactory accuracy. To this end, the dose distribution D(x,y) is preferably calculated according to the pattern density ρ as executed in step S102 of FIG. 3A.

A method of calculating the fogging electron amount distribution F(x,y,σ) executed in step S106 shown in each of FIGS. 3A and 3B to calculate the position displacement amount distribution that enables the description of the above measured results will next be explained.

Assume that a function g(x,y) descriptive of a spread distribution of fogged electrons exists with respect to an exposure distribution E(x,y) firstly in above Step S106. This function g(x,y) is a model of a Gaussian distribution such as shown in FIG. 7 in a manner similar to the comparative example and can be expressed like the following equation (2):

$$g(x,y)=(1/\pi\sigma^2)\times\exp\{-(x^2+y^2)/\sigma^2\} \quad (2)$$

The fogging electron amount distribution (called also "fogging electron amount intensity") F(x,y,σ) is determined as expressed in the following equation (3) by convolution integral of the spread distribution function g(x,y) and the exposure distribution E(x,y).

$$F(x,y,\sigma)=\iint g(x-x'',y-y'')E(x'',y'')dx''dy'' \quad (3)$$

The calculation of the charge amount distribution C(x,y) executed in step S108 shown in each of FIGS. 3A and 3B will next be explained.

Assume that a function C(E,F) for determining the charge amount distribution C(x,y) from the exposure distribution E(x,y) and the fogging electron amount distribution F(x,y,σ) exists firstly in above Step S108. The so-assumed function C(E,F) is separated into a variable $C_E(E)$ to which irradiation or exposure electrons contribute and a variable $C_F(F)$ to which fogging electrons contribute, as expressed in the following equation (4):

$$C(E,F)=C_E(E)+C_F(F) \quad (4)$$

Figure 19A:
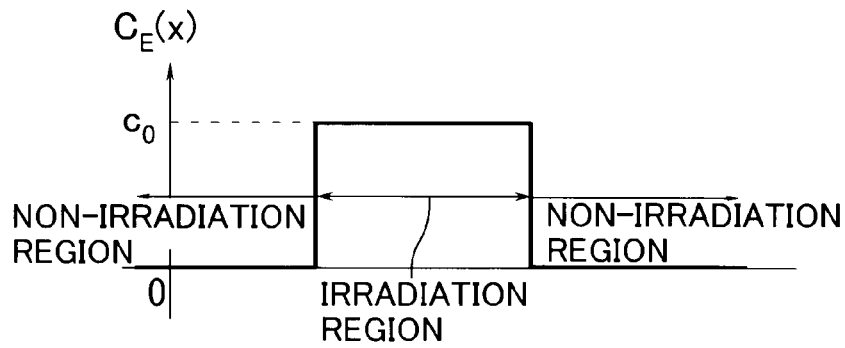
FIG. 19A is a diagram showing a function of a charge amount distribution in an irradiation region.
Figure 19B:
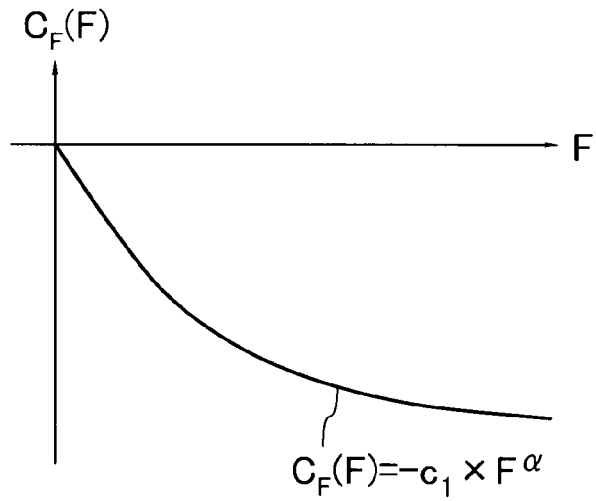
FIG. 19B is a diagram illustrating a function of a charge amount distribution in a non-irradiation region.

Further, the function for the irradiation region has been assumed to be the variable $C_F(F)=0$, i.e., $C(E,F)=C_E(E)$. On the other hand, the function for the non-irradiation region has been assumed to be the variable $C_E(E)=0$, i.e., $C(E,F)=C_F(F)$. As shown in FIG. 19A, the electrons are electrostatically charged uniformly within the irradiation region, that is, the variable was assumed to be $C_E(E)=c_o$. This $c_o$ is a constant, e.g., 1. In the non-irradiation region as shown in FIG. 19B, the charge $C_F(F)$ is saturated as the fogging electron amount intensity F becomes larger. Therefore, the variable $C_F(F)$ in the non-irradiation region will be expressed like the following equation (5):

$$C_F(F)=-c_1 \times F^\alpha \quad (5)$$

α in the above equation (5) satisfies a condition of 0<α<1. According to the experiments of the present inventors, it has been found out that α becomes closest to the result of experiments when α is greater than or equal to 0.3 and is smaller than or equal to 0.4, and is suitable. This suitable range of a can be varied according to the used electron beam writing apparatus.

The reason why the function $C_F(F)$ is defined as expressed in the above equation (5) will be explained here.

The measured results of position displacements are obtained with respect to the four types of pattern densities (100%, 75%, 50% and 25%) as shown in FIGS. 15A through 17D. Assuming that the fogging electron amount intensity F at the pattern density of 100% is $F_{100}$, the fogging electron amount intensities at the respective pattern densities are respectively brought to $F_{100}$, $0.75 \times F_{100}$, $0.5 \times F_{100}$ and $0.25 \times F_{100}$ in proportion to the pattern density. However, $C_F(F)$ is an unknown function. Therefore, there is a possibility that $C_F(F_{100})$, $C_F(0.75 \times F_{100})$, $C_F(0.5 \times F_{100})$ and $C_F(0.25 \times F_{100})$ will not be proportional in intensity and differ from one another in distribution form at the respective pattern densities. When the distribution forms at the respective pattern densities differ in this way, $C_F(F)$ must be defined for every pattern density, thus resulting in inconvenience in terms of analysis.

Therefore, such a function $C_F(F)$ that distribution forms of similar figures are obtained even if the pattern density changes, was defined with respect to a given F. That is, the function $C_F(F)$ was defined so as to satisfy the relationship of the following equation (6). a in the following equation (6) indicates a pattern density, and A is a constant.

$$C_F(aF)/C_F(F)=A \quad (6)$$

If a function related to similar figures is taken, then the distribution form remains unchanged even if $C_F(F)$ is not proportional in its entire intensity. The intensity can be adjusted by a combination of the parameters $c_0$ and $c_1$. Thus, there is no need to define $C_F(F)$ for every pattern density and one $C_F(F)$ may simply be defined with respect to one σ. Therefore, the analysis can be simplified.

Figure 20:
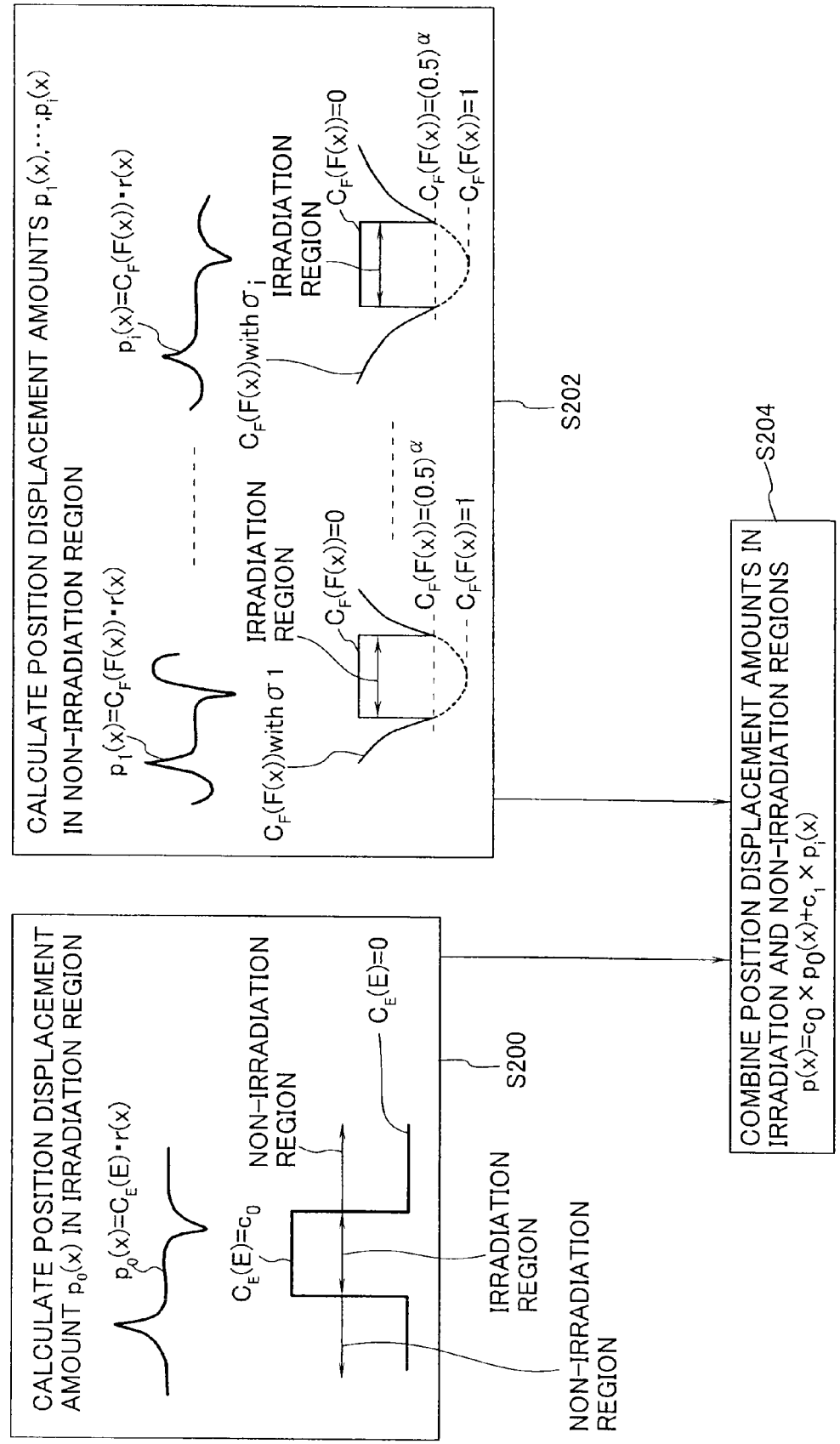
FIG. 20 is a diagram for describing a method for determining an optimum combination of parameters $c_0$, $c_1$ and $\sigma_i$.

The optimum combination of the parameters $c_0$, $c_1$ and $\sigma_i$ is next determined with reference to FIG. 20. Here, the unit of the parameters $c_0$ and $c_1$ is [μC/cm²], and unit of the parameter σ is [mm].

A step-shaped charge amount distribution $C_E(E)$ having a magnitude of $c_0$ is assumed to exist in an irradiation region as shown in FIG. 20. A position displacement amount $p_0(x)$ is calculated by convolution integral of the charge amount distribution $C_E(E)$ and the pre-calculated response function $r(x)$ (Step S200).

In a non-irradiation region, $C_F(F)$ is calculated assuming that given α and a fogging electron spread radius (hereinafter called "fog radius") σ are given (Step S202). The $C_F(F)$ is determined with respect to a plurality of fog radii σ. For example, the fog radius σ is assumed to be defined at 1 mm intervals between 1 mm and 24 mm. Then, position displacement amounts $p_1(x)$ through $p_i(x)$ are determined using the charge amount distribution $C_F(F)$ and the response function r relative to the fog radii $\sigma_1$ through $\sigma_i$.

Combining the position displacement amounts p(x) in these irradiation and non-irradiation regions, p(x) is expressed like the following equation (7) (Step S204):

$$p(x) = c_0 \times p_0(x) + c_1 \times p_i(x) \quad (7)$$

Figure 21A:
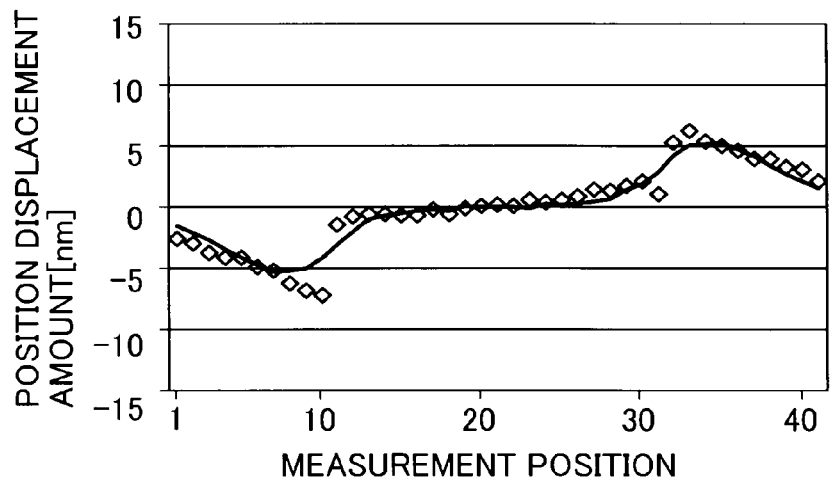
FIG. 21A is a diagram showing a fitting result in the case of a resist A and a pattern density of 25%.
Figure 21B:
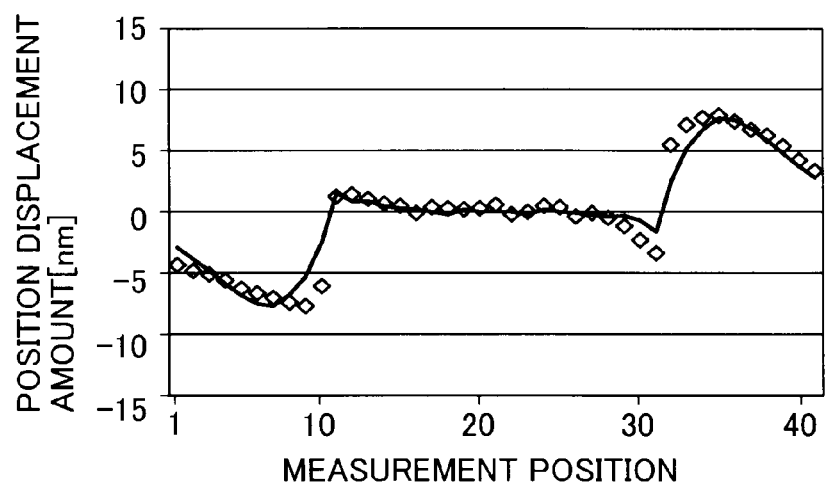
FIG. 21B is a diagram showing a fitting result in the case of the resist A and a pattern density of 50%.
Figure 21C:
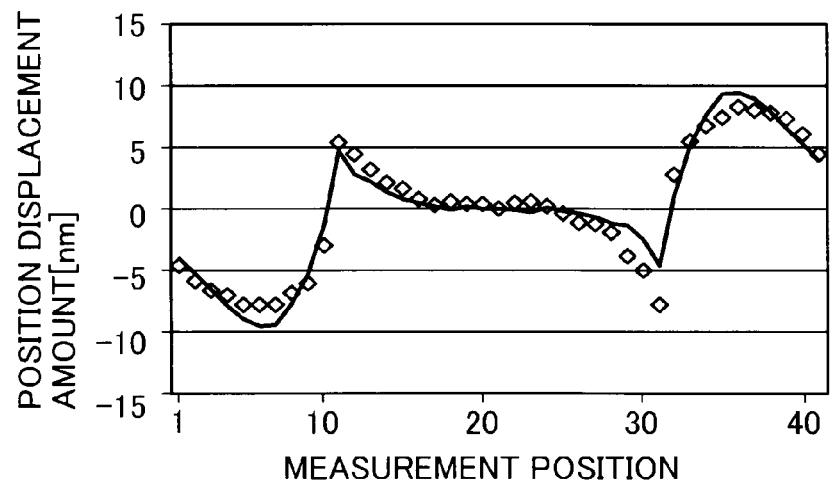
FIG. 21C is a diagram showing a fitting result in the case of the resist A and a pattern density of 75%.
Figure 21D:
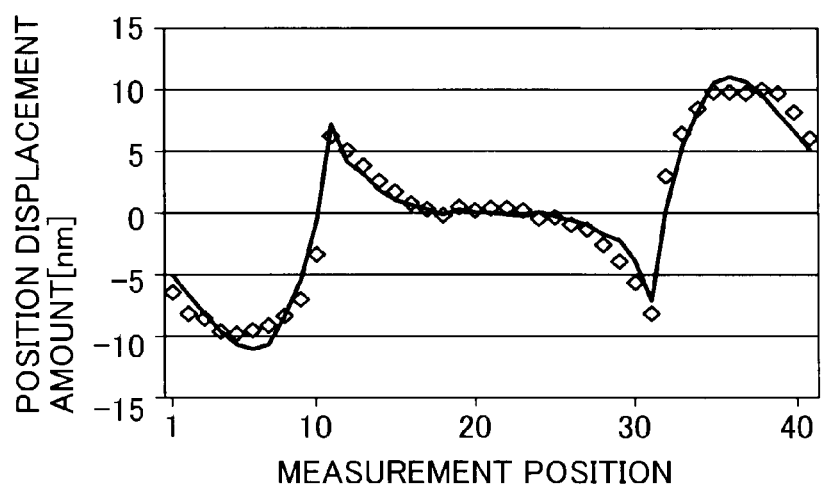
FIG. 21D is a diagram showing a fitting result in the case of the resist A and a pattern density of 100%.
Figure 22A:
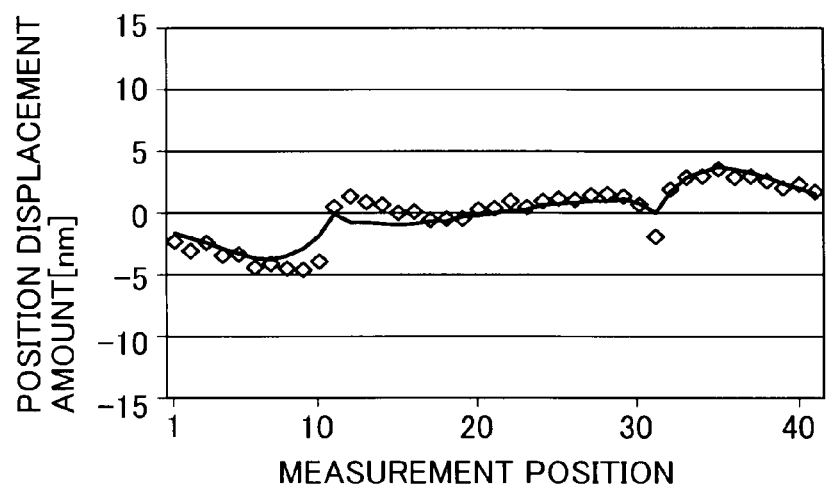
FIG. 22A is a diagram showing a fitting result in the case of a resist B and a pattern density of 25%.
Figure 22B:
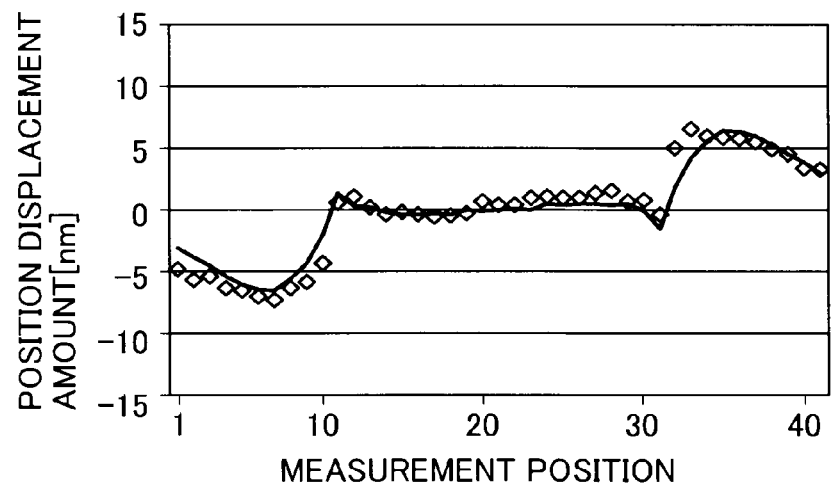
FIG. 22B is a diagram showing a fitting result in the case of the resist B and a pattern density of 50%.
Figure 22C:
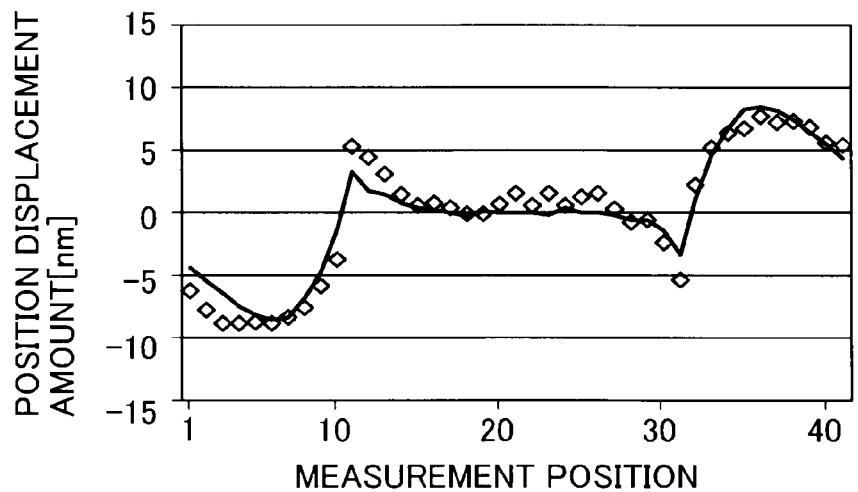
FIG. 22C is a diagram showing a fitting result in the case of the resist B and a pattern density of 75%.
Figure 22D:
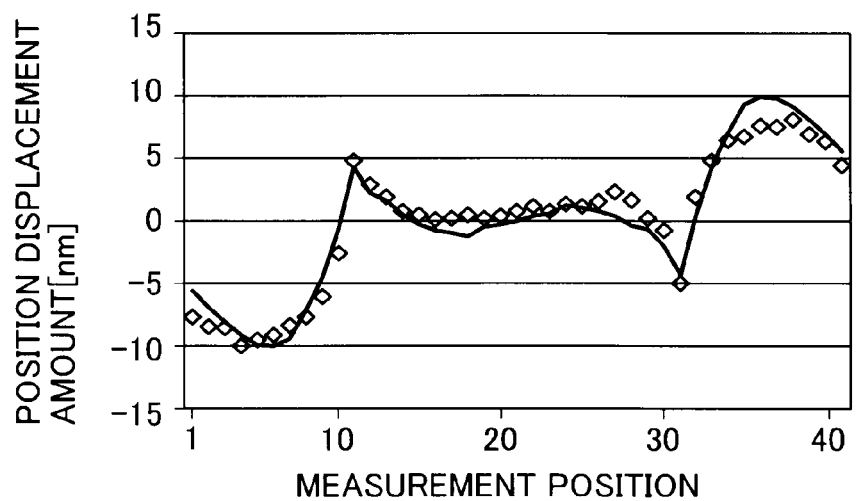
FIG. 22D is a diagram showing a fitting result in the case of the resist B and a pattern density of 100%.
Figure 23A:
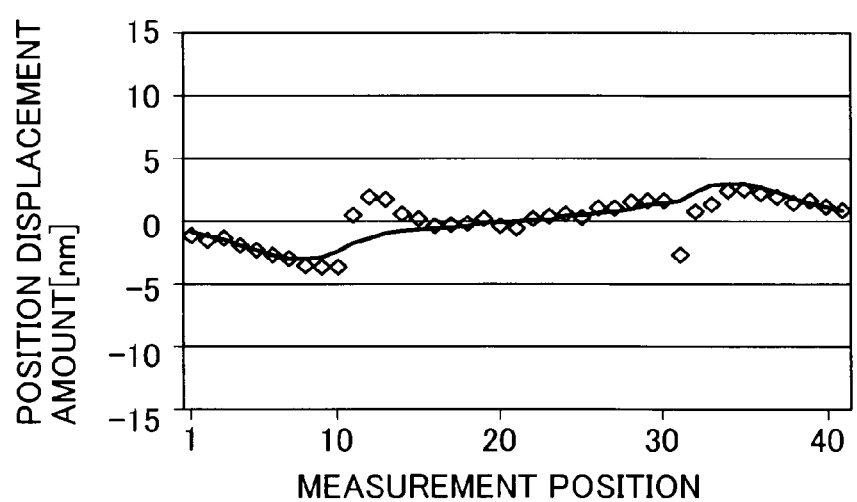
FIG. 23A is a diagram showing a fitting result in the case of a resist C and a pattern density of 25%.
Figure 23B:
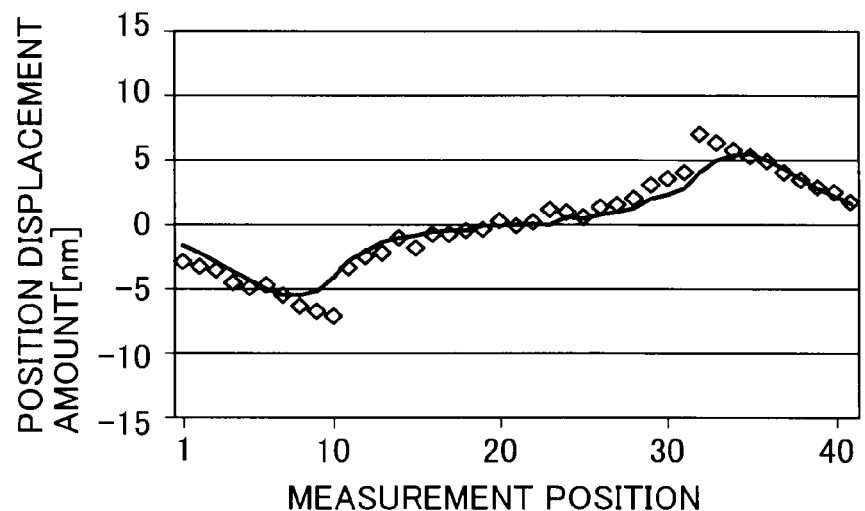
FIG. 23B is a diagram showing a fitting result in the case of the resist C and a pattern density of 50%.
Figure 23C:
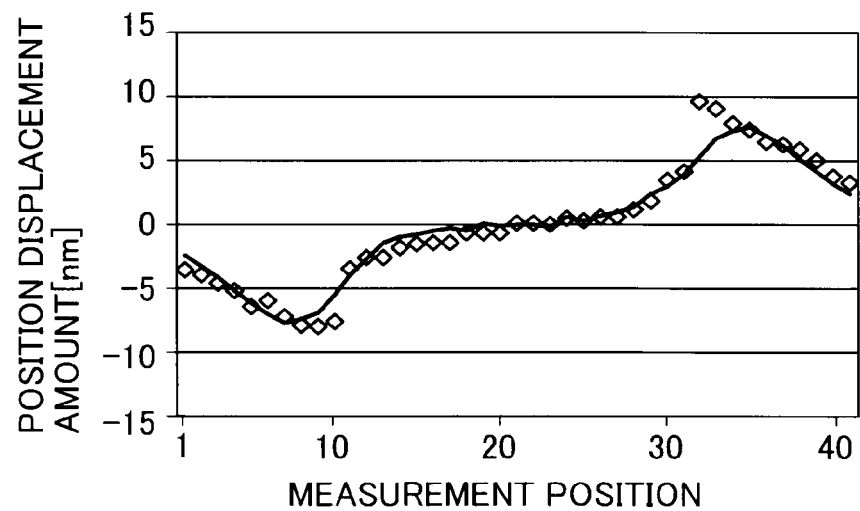
FIG. 23C is a diagram showing a fitting result in the case of the resist C and a pattern density of 75%.
Figure 23D:
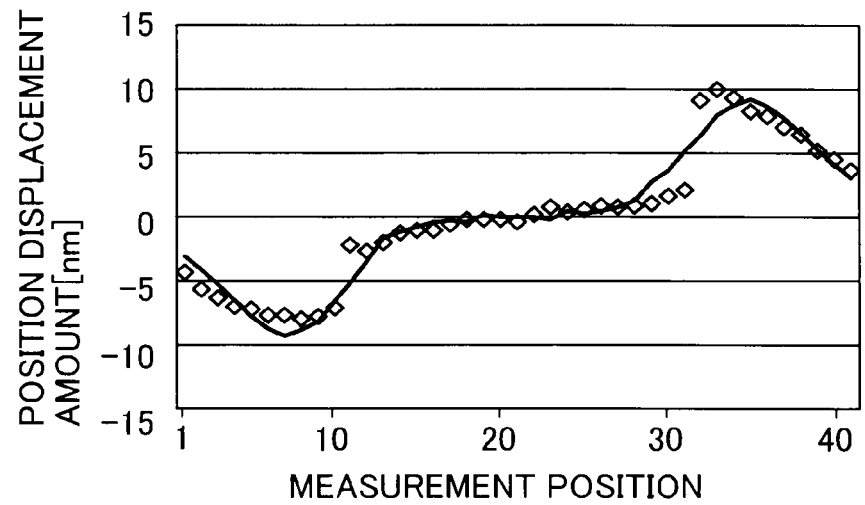
FIG. 23D is a diagram showing a fitting result in the case of the resist C and a pattern density of 100%.

Combinations of parameters $c_0$, $C_1$ and σ at which the above equation (7) is fit best for the result of experiments (fitting) are determined. FIGS. 21A through 21D, FIGS. 22A through 22D and FIGS. 23A through 23D are respectively diagrams showing fitting results about the resists A, B and C. FIGS. 21A, 22A and 23A respectively show fitting results where the pattern density of the irradiation pad 63 is 25%. FIGS. 21B, 22B and 23B respectively show fitting results where the pattern density of the irradiation pad 63 is 50%. FIGS. 21C, 22C and 23C respectively show fitting results where the pattern density of the irradiation pad 63 is 75%. FIGS. 21D, 22D and 23D respectively show fitting results where the pattern density of the irradiation pad 63 is 100%.

Using the results shown in FIGS. 21A through 23D, position displacement amount distributions can be determined with satisfactory accuracy as compared with the comparative example.

FIGS. 24A through 24C are respectively diagrams showing the optimum combinations of parameters $c_0$, $c_1$ and σ determined by fitting with respect to the resists A, B and C.

On the other hand, it has been found out that even when the same kind of resists are used, they are different in optimum fog radius σ when different in pattern density as shown in FIGS. 24A through 24C. It is desired that the fog radius σ does not change depending on the pattern density physically. Although the satisfactory fitting result is obtained with respect to the resist A, the fitting results more satisfactory than the resist A were not obtained with respect to the resists B and C. According to the discussions of the present inventors, these results are considered to be due to the fact that the charge in the irradiation region is assumed to be flat as $C_E(E)=c_0$.

Therefore, the present inventors have modified the model in such a manner that the influence of fogging electrons is described even in the charge amount distribution in the irradiation region. In such a model, the charge amount distribution in the irradiation region was represented like the following equation (8). However, the charge amount distribution in the non-irradiation region was set in a manner similar to the above model.

$$C(E,F) = C_E(E) + C_{Fe}(F) = c_0 - c_1 \times F^\alpha \quad (8)$$

Figures 25A, 25B, 26:
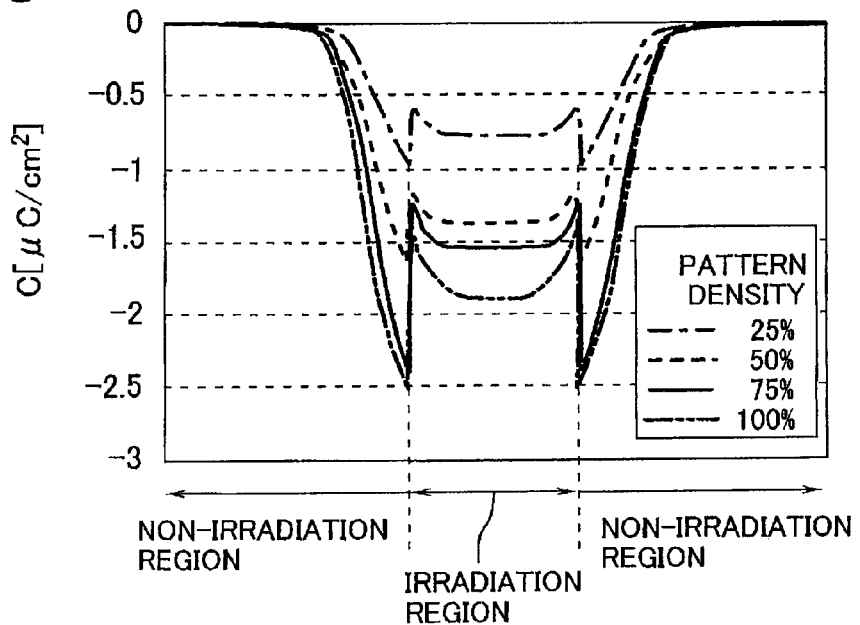
FIG. 25A is a diagram showing combinations of parameters $c_0$, $c_1$ and $\sigma$ determined from a modified model of resist B.
FIG. 25B is a diagram showing combinations of parameters $c_0$, $c_1$ and $\sigma$ determined from a modified model of resist C.
FIG. 26 is a diagram showing a charge amount distribution $C(x,0)$.

Combinations of parameters $c_0$, $c_1$ and σ determined as to the modified model are shown in FIGS. 25A and 25B. FIGS. 25A and 25B respectively show the combinations of the parameters $c_0$, $c_1$ and σ about the resists B and C. As shown in FIGS. 25A and 25B, the modified model still has dependence of the fog radius σ on the pattern density. Further, it has been found out that although $c_1$ determined by fitting must be convolved or overlaid on the curved line of the equation (4), it has not been overlaid thereon.

Therefore, the present inventors have constructed a new generalized model for solving these.

The relationship between the charge amount distribution $C_F(F)$ in the non-irradiation region and the fogging electron amount intensity F was first represented by a polynomial function like the following equation (9). In the following equation (9), $f_1$, $f_2$ and $f_3$ are constants respectively.

$$C_F(F) = f_1 \times F + f_2 \times F^2 + f_3 \times F^3 \quad (9)$$

Next, charge amount distributions C(x,0) at y=0 were calculated for the respective pattern densities using parameter groups shown in FIGS. 24A through 25B. The calculated charge amount distributions C(x,0) are shown in FIG. 26. The reason why the parameter groups shown in FIGS. 24A through 25B are used is that although each optimum fog radius σ changes depending on the pattern density, the distribution form at each pattern density is proper.

Incidentally, the accuracy of fitting to be executed below can be improved by calculating the charge amount distribution C(x,y) on a two-dimensional basis without making a limit to y=0.

Figure 27A:
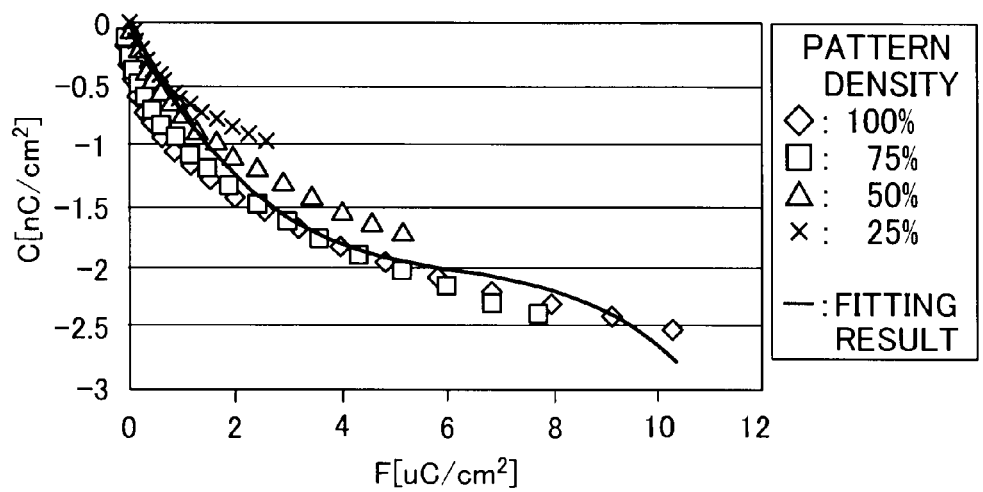
FIG. 27A is a diagram showing a fitting result obtained when a fog radius $\sigma$ is extremely small.
Figure 27B:
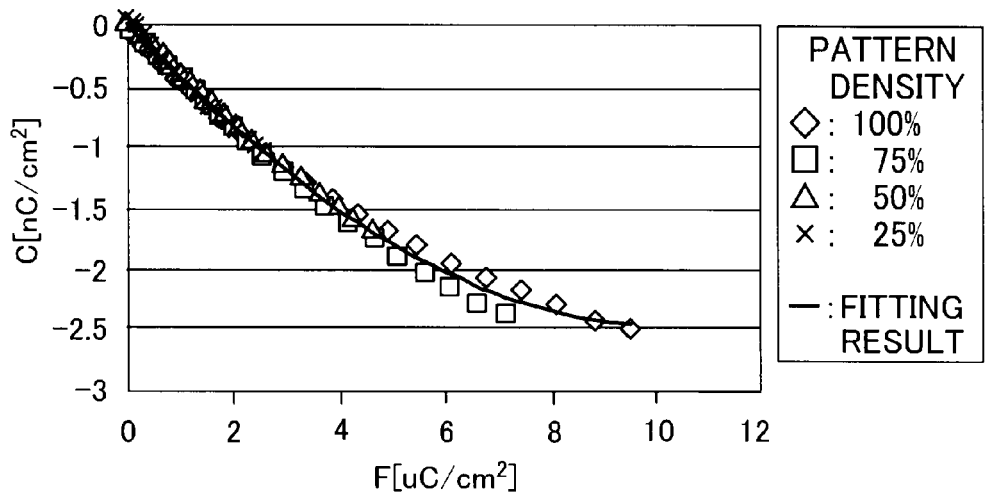
FIG. 27B is a diagram showing a fitting result obtained when the fog radius $\sigma$ is optimum.
Figure 27C:
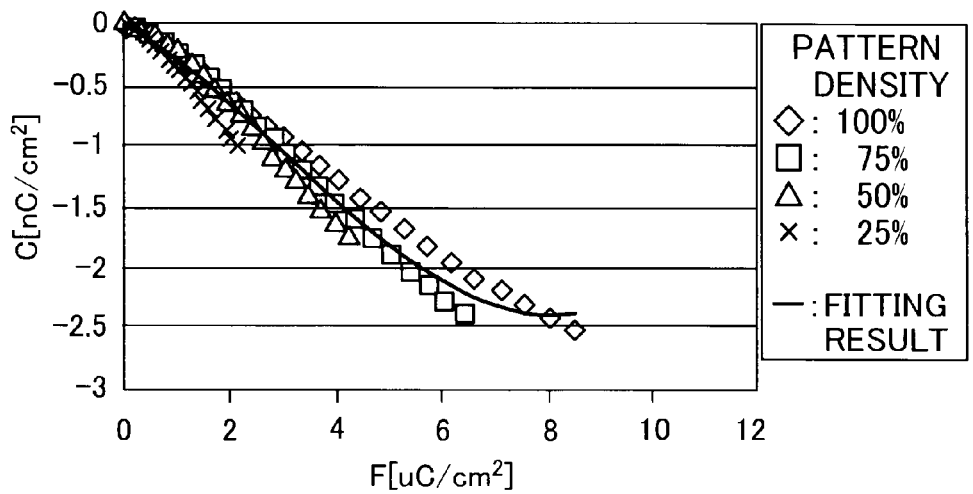
FIG. 27C is a diagram showing a fitting result obtained when the fog radius $\sigma$ is excessively large.

Such an optimum fog radius σ that the charge amount distribution C(x,0) in the non-irradiation region shown in FIG. 26 and $C_F(F)$ of the above equation (9) are most fit is then determined. Satisfactory fitting results cannot be obtained where the fog radius σ is excessively small as shown in FIG. 27A and the fog radius σ is excessively large as shown in FIG. 27C. Namely, since data about respective pattern densities are separated from one another when the fog radius σ becomes excessively small or large, the above parameters $f_1$, $f_2$ and $f_3$ cannot be determined. On the other hand, when a satisfactory fitting result is obtained where the optimum fog radius σ is determined as shown in FIG. 27B, and hence the above parameters $f_1$, $f_2$ and $f_3$ can be determined.

Next, the fogging electron amount distribution F in the irradiation region is determined using the determined optimum fog radius σ. The charge amount distribution C(E,F) in the irradiation region was represented by a polynomial function like the following equation (10) using the exposure distribution E and the fogging electron amount distribution F determined in the above equation (9). The charge amount distribution $C_{Fe}(F)$ to which the fogging electrons contribute is considered in the following equation (10):

$$\begin{aligned} C(E, F) &= C_E(E) + C_{Fe}(F) \\ &= (d_0 + d_1 \times \rho + d_2 \times D + d_3 \times E) + \\ &\quad (e_1 \times F + e_2 \times F^2 + e_3 \times F^3) \end{aligned} \quad (10)$$

Figure 28:
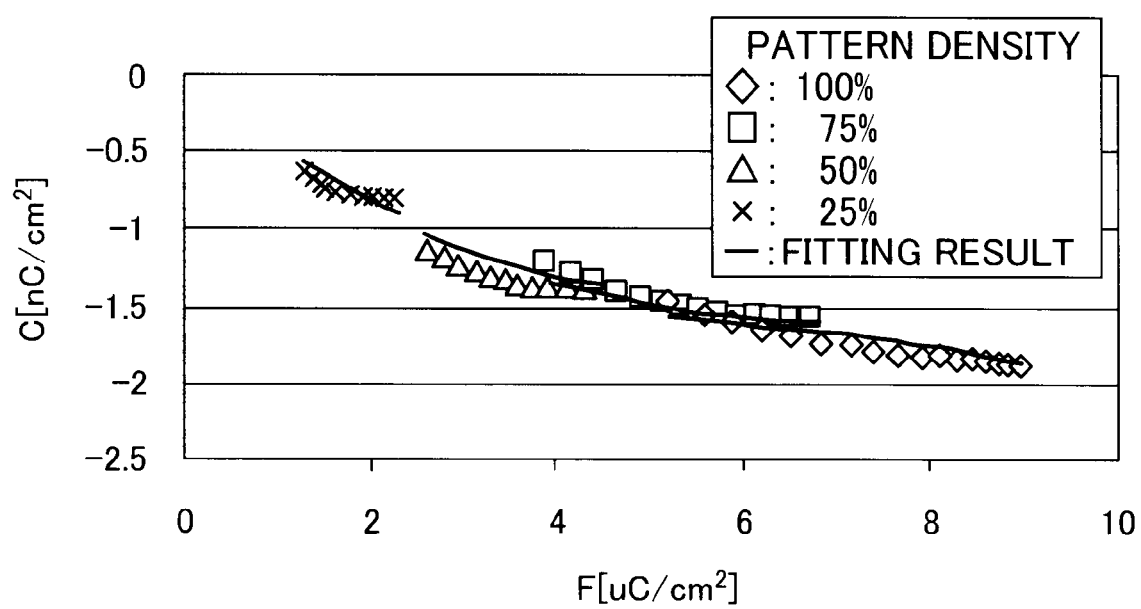
FIG. 28 is a diagram showing fitting results of a charge amount distribution $C(x,0)$ in an irradiation region and a charge amount distribution $C(E,F)$.

Then, such parameters $d_0$, $d_1$, $d_2$, $d_3$, $e_1$, $e_2$ and $e_3$ that the charge amount distribution C(x,0) in the irradiation region shown in FIG. 26 and the charge amount distribution C(E,F) of the above equation (10) are most fit, are determined. Here, a fitting result is shown in FIG. 28.

The optimum combinations of the parameters $d_0$, $d_1$, $d_2$, $d_3$, $e_1$, $e_2$, $e_3$, $f_1$, $f_2$, $f_3$ and σ determined by fitting of the charge amount distributions in these irradiation and non-irradiation regions are shown in FIG. 29. Here, the unit of the parameters $d_0$ and $d_1$ is [nC/cm$^2$]. The unit of the parameters $d_2$, $d_3$, $e_1$ and $f_1$ is [(nC/cm$^2$)/(μC/cm$^2$)] or [1/1000] or [‰]. The unit of the parameters $e_2$ and $f_2$ is [(nC/cm$^2$)/(μC/cm$^2$)$^2$]. The unit of the parameters $e_3$ and $f_3$ is [(nC/cm$^2$)/(μC/cm$^2$)$^3$]. As shown in FIG. 29, the optimum fog radius σ is selected from a range of 8 mm to 16 mm according to the type of resist. This generalized model is different from the model using the above function related to the similar figures and remains unchanged in the optimum fog radius σ even if the pattern density changes. Incidentally, it has been found out that as to the resists A of the same type as shown in FIG. 29, the optimum fog radius σ (=13 mm) taken where the dose D is fixed without depending on the pattern density ρ, and the optimum fog radius σ (=8 mm) taken where the dose D is changed in accordance with the proximity effect correction equation (1) of the backscattered electrons depending on the pattern density ρ are different from one another.

Incidentally, since the optimum fog radius σ are different where the resists differ in thickness, the optimum fog radii σ may be individually determined in accordance with the above method with the resists different in thickness as different resists.

Figure 30A:
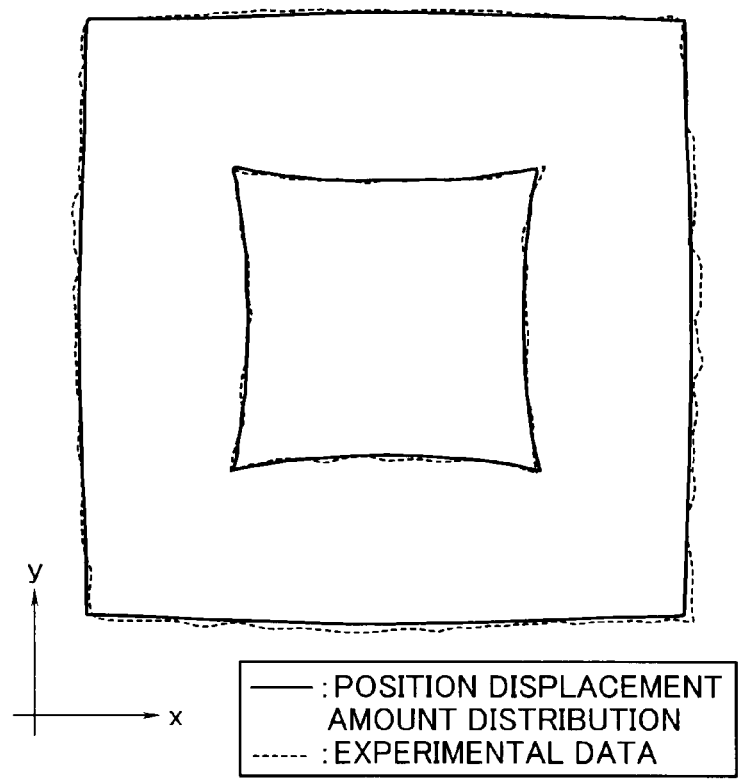
FIG. 30A is a diagram showing a fitting result of a position displacement amount distribution and experimental data for the resist A both determined by a generalized model according to the present embodiment.
Figure 30B:
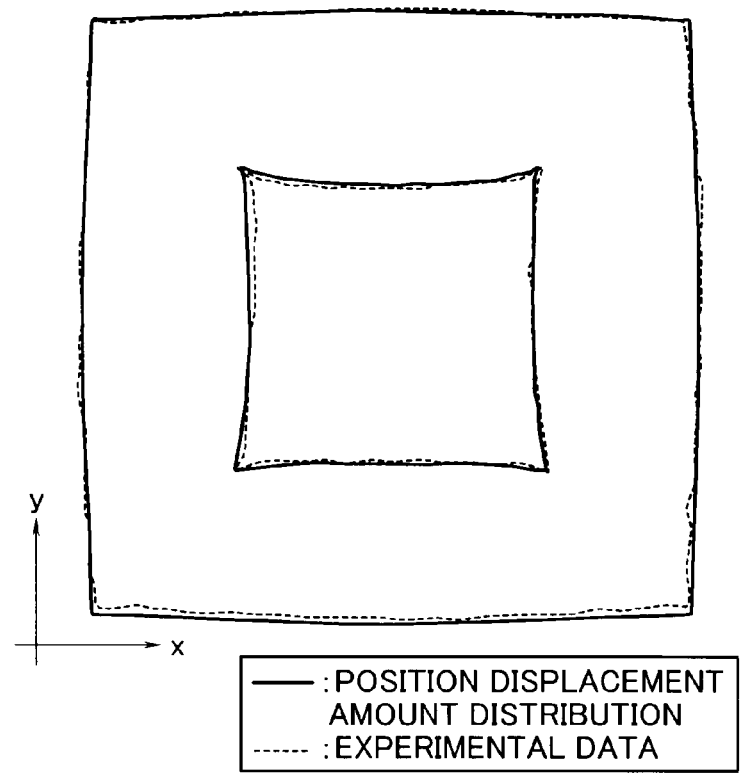
FIG. 30B is a diagram showing a fitting result of a position displacement amount distribution and experimental data for the resist B both determined by the generalized model according to the present embodiment.
Figure 30C:
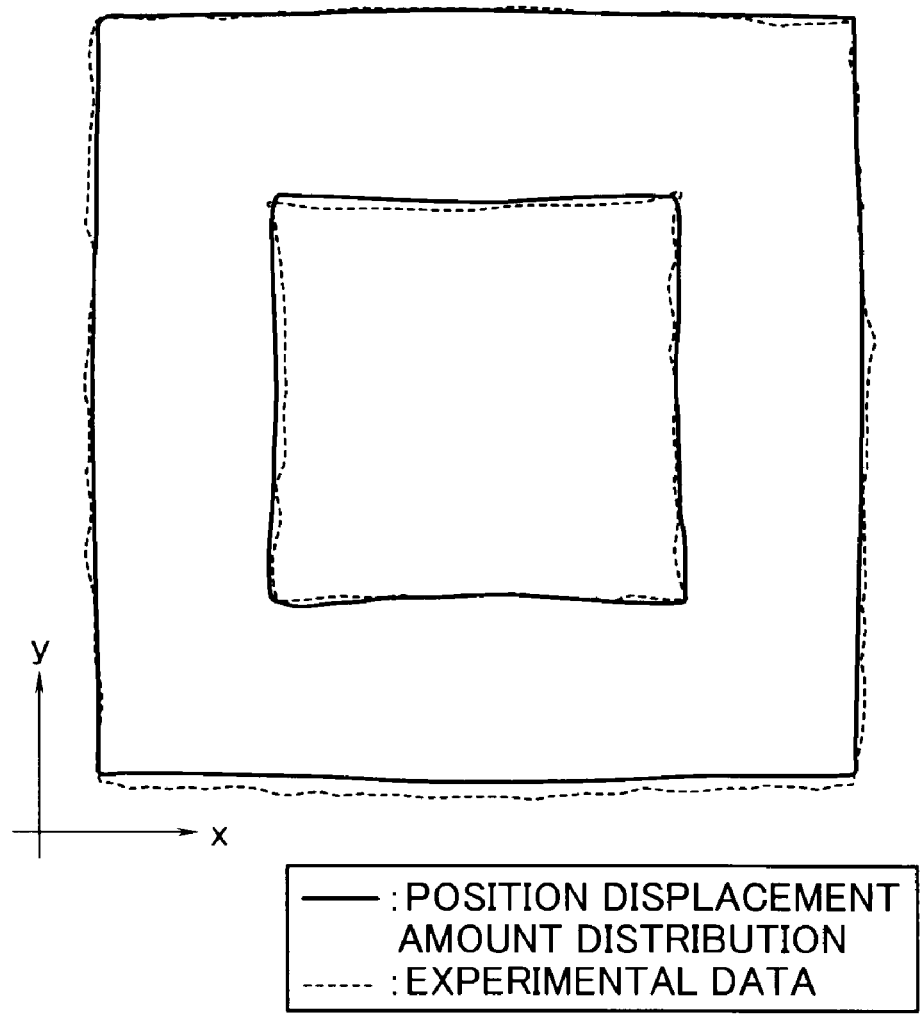
FIG. 30C is a diagram showing a fitting result of a position displacement amount distribution and experimental data for the resist C both determined by the generalized model according to the present embodiment.

A position displacement amount distribution p(x,y) is calculated using the so-determined charge amount distribution C(x,y) in step S110 shown in each of FIGS. 3A and 3B. FIGS. 30A through 30C are respectively diagrams showing fitting results between the position displacement amount distributions determined in the generalized model according to the present embodiment and experimental data with respect to resists A, B and C. In the figures, the position displacement amount distributions determined in the generalized model are shown in solid lines and the experimental data are shown in broken lines, respectively. FIGS. 30A through 30C also schematically show position displacements in the neighborhood of a boundary between irradiation and non-irradiation regions, and position displacements in the outer periphery of the non-irradiation region in a manner similar to FIGS. 14A through 14C. In each of the resists A, B and C, the determined position displacement amount distribution and the experimental data approximately coincide with each other. Determining the position displacement amount distributions using the generalized model established by the present inventors as shown in FIGS. 30A through 30C enables the calculation of the position displacement amount distributions with satisfactory accuracy.

Figure 31:
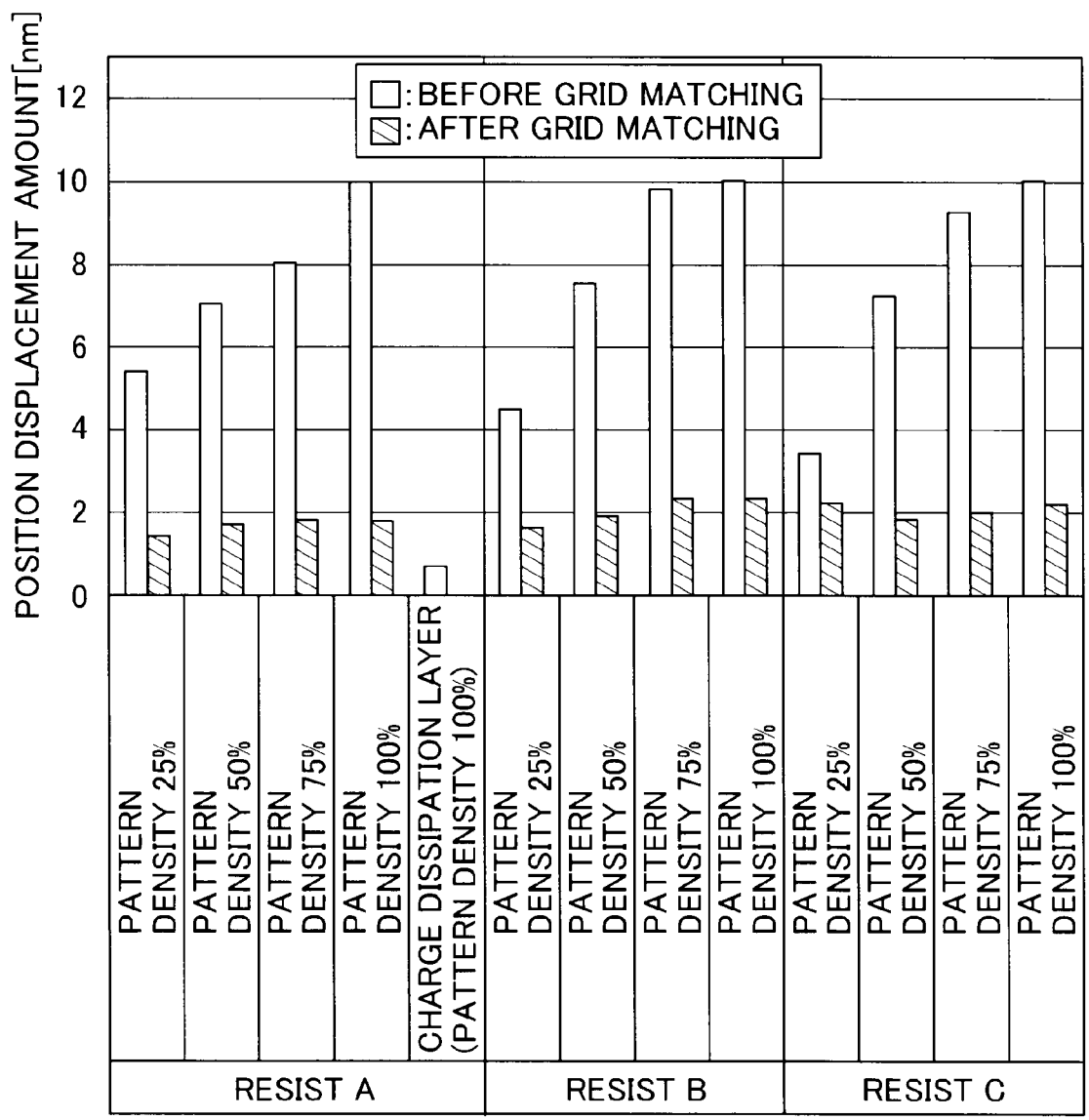
FIG. 31 is a diagram showing beam-irradiation position displacement amounts left after grid matching.

A beam position displacement due to charging effects is corrected by performing the grid matching as shown in FIG. 5 using the position displacement amount distributions. FIG. 31 is a diagram showing beam irradiation position displacement amounts prior and subsequent to the grid matching. As shown in oblique lines in FIG. 31, each of the beam irradiation position displacement amounts that remain after the grid matching is reduced to a level equivalent to one in the case in which a charge dissipation film or layer is used.

On the other hand, it has been found out that satisfactory fitting results are obtained by bringing a contribution of fog electrons in a charge amount distribution for an irradiation region to $C_{Fe}(F)=0$ in a certain kind of resist as in the resists A and D. This is understood even from the parameters $e_1=e_2=e_3=0$ related to the resists A and D shown in FIG. 29. The generalized model constructed by the present inventors can be adapted even to this type of resists A and D.

A physical effect referred to as EBIC (electron beam induced conductivity) at which each resist has conductivity only for a moment by irradiation of an electron beam has been known. The above generalized model is adaptable even to the EBIC. Namely, since the EBIC is of a phenomenon that occurs only by the irradiation of the electron beam, electrical charges are accumulated as a non-irradiation region until the electron beam is applied. The so-accumulated electrical charges escape to the base due to the irradiation of the electron beam. Therefore, $C_{Fe}(F)$ based on fog electrons is temporarily reset and starts to be accumulated from zero. Further, once the electron beam is applied, there is a case in which conductivity slightly remains. In this case, the charge amount of fog electrons is reduced after the irradiation of the electron beam as compared with before the irradiation of the electron beam. The generalized model can adapt to such a reduction in charge amount by shifting the parameters $f_1$, $f_2$ and $f_3$ descriptive of the non-irradiation region to the parameters $e_1$, $e_2$ and $e_3$ descriptive of the irradiation region.

Incidentally, the present invention is not limited to the above embodiment and can be modified in various ways within the scope not departing from the gist of the invention. For example, although the electron beam is used in the present embodiment, the present invention is not limited to it, but also applicable to a case in which other charged-particle beams such as ion beams are used.

The features and advantages of the present invention may be summarized as follows.

According to one aspect of the present invention, charge amount distributions in irradiation and non-irradiation regions are calculated using an exposure distribution and a fogging electron amount distribution instead of directly obtaining a position displacement amount distribution from the exposure distribution through a linear response function, and the position displacement amount distribution is calculated based on the charge amount distributions. It is therefore possible to calculate a position displacement of a beam lying on a sample, which has not been calculated where a linear proportional relationship has been taken into consideration. Thus, a beam position displacement due to a charging effect can be corrected with satisfactory accuracy.

According to another aspect of the present invention, a distribution of a position displacement amount of a charged-particle beam lying on a sample is calculated based on charge amount distributions in irradiation and non-irradiation regions, and a deflector is controlled based on the position displacement amount distribution. It is therefore possible to correct a beam position displacement due to a charging effect with satisfactory accuracy.

Obviously many modifications and variations of the present invention are possible in the light of the above teachings. It is therefore to be understood that within the scope of the appended claims the invention may be practiced otherwise than as specifically described.

The entire disclosure of a Japanese Patent Applications No. 2008-077008, filed on Mar. 25, 2008 and No. 2008-331585, filed on Dec. 25, 2008 including specification, claims, drawings and summary, on which the Convention priority of the present application is based, are incorporated herein by reference in its entirety.

What is claimed is:

1. A charged-particle beam writing method for deflecting a charged-particle beam and writing each pattern onto a sample placed on a stage, comprising the steps of:

calculating a charge amount distribution in an irradiation region of the charged-particle beam and a charge amount distribution in a non-irradiation region thereof, using an exposure distribution of the charged-particle beam applied onto the sample, and a fogging electron amount distribution;

calculating a distribution of a position displacement amount of the charged-particle beam on the sample, based on the charge amount distributions in the irradiation and non-irradiation regions; and deflecting the charged-particle beam, based on the distribution of the position displacement amount and writing each pattern onto the sample.

2. The charged-particle beam writing method according to claim 1, further including a step for calculating the fogging electron amount distribution, based on the exposure distribution and a spread distribution of fog electrons expanded from the irradiation region of the sample irradiated with the charged-particle beam to the non-irradiation region.

3. The charged-particle beam writing method according to claim 2, the fogging electron amount distribution is calculated by convolution the exposure distribution and integral of the spread distribution function.

4. The charged-particle beam writing method according to claim 1, further including a step for calculating a dose distribution, based on a pattern density distribution set for every predetermined region of the sample, and
a step for calculating the exposure distribution, based on the pattern density distribution and the dose distribution.

5. The charged-particle beam writing method according to claim 4, the dose distribution is calculated using a proximity effect correction equation of backscattered electrons.

6. The charged-particle beam writing method according to claim 1, wherein the charge amount distribution in the non-irradiation region is calculated using a function $C_F(F)$ expressed in the following equation (a):

$$C_F(F) = -c_1 \times F^\alpha \tag{a}$$

(where F: fogging electron amount distribution, $c_1$: constant, and $0 < \alpha < 1$), and wherein the charge amount distribution in the irradiation region is calculated using a function $C_E(E,F)$ expressed in the following equation (b):

$$C_E(E,F) = C_E(E) + C_{Fe}(F) = c_0 - c_1 \times F^\alpha \tag{b}$$

(where E: exposure distribution, F: fogging electron amount distribution, $c_0$ and $c_1$: constants, and $0 < \alpha < 1$).

7. The charged-particle beam writing method according to claim 6, wherein $0.3 \leq \alpha \leq 0.4$ in the equations (a) and (b).

8. The charged-particle beam writing method according to claim 1, wherein the charge amount distribution in the non-irradiation region is calculated using a function $C_F(F)$ expressed in the following equation (a):

$$C_F(F) = -c_1 \times F^\alpha \tag{a}$$

(where F: fogging electron amount distribution, $c_1$: constant, and $0 < \alpha < 1$).

9. The charged-particle beam writing method according to claim 8, wherein $0.3 \leq -\alpha \leq 0.4$ in the equation (a).

10. The charged-particle beam writing method according to claim 1, wherein the charge amount distribution in the irradiation region is calculated using a function $C_E(E,F)$ expressed in the following equation (b):

$$C_E(E,F) = C_E(E) + C_{Fe}(F) = c_0 - c_1 \times F^\alpha \tag{b}$$

(where E: exposure distribution, F: fogging electron amount distribution, $c_0$ and $c_1$: constants, and $0 \leq \alpha \leq 1$).

11. The charged-particle beam writing method according to claim 10, wherein $0.3 \leq \alpha \leq 0.4$ in the equation (b).

12. The charged-particle beam writing method according to claim 1, wherein the charge amount distribution in the irradiation region is calculated using a polynomial function of pattern density distribution, the dose distribution, the exposure distribution and the fogging electron amount distribution, and wherein the charge amount distribution in the non-irradiation region is calculated using a polynomial function of the fogging electron amount distribution.

13. The charged-particle beam writing method according to claim 1, wherein the charge amount distribution in the irradiation region is calculated using a polynomial function expressed in the following equation (c):

$$C(E,F) = (d_0 + d_1 \times \rho + d_2 \times D + d_3 \times E) + (e_1 \times F + e_2 \times F^2 + e_3 \times F^3) \tag{c}$$

(where $\rho$: pattern density distribution, D: dose distribution, E: exposure distribution, F: fogging electron amount distribution, and $d_0$, $d_1$, $d_2$, $d_3$, $e_1$, $e_2$ and $e_3$: constants).

14. The charged-particle beam writing method according to claim 1, wherein the charge amount distribution in the non-irradiation region is calculated using a polynomial function expressed in the following equation (d):

$$C_F(F) = f_1 \times F + f_2 \times F^2 + f_3 \times F^3 \tag{d}$$

(where F: fogging electron amount distribution, and $f_1$, $f_2$ and $f_3$: constants).

15. The charged-particle beam writing method according to claim 1, wherein the charge amount distribution in the irradiation region is calculated using a polynomial function expressed in the following equation (c):

$$C(E,F) = (d_0 + d_1 \times \rho + d_2 \times D + d_3 \times E) + (e_1 \times F + e_2 \times F^2 + e_3 \times F^3) \tag{c}$$

(where $\rho$: pattern density distribution, D: dose distribution, E: exposure distribution, F: fogging electron amount distribution, and $d_0$, $d_1$, $d_2$, $d_3$, $e_1$, $e_2$ and $e_3$: constants), and
wherein the charge amount distribution in the non-irradiation region is calculated using a polynomial function expressed in the following equation (d):

$$C_F(F) = f_1 \times F + f_2 \times F^2 + f_3 \times F^3 \tag{d}$$

(where F: fogging electron amount distribution, and $f_1$, $f_2$ and $f_3$: constants).

16. A charged-particle beam writing apparatus for deflecting a charged-particle beam by a deflector and writing each pattern onto a sample placed on a stage, comprising:
position displacement amount distribution calculating means for calculating a distribution of a position displacement amount of the charged-particle beam lying on the sample, based on a charge amount distribution in an irradiation region of the sample irradiated with the charged-particle beam, and a charge amount distribution in a non-irradiation region unirradiated therewith; and
deflector control means for controlling the deflector based on the distribution of the position displacement amount.

17. The charged-particle beam writing apparatus according to claim 16, further including charge amount distribution calculating means for calculating the charge amount distributions in the irradiation and non-irradiation regions using an exposure distribution of the charged-particle beam applied onto the sample and a fogging electron amount distribution.

18. The charged-particle beam writing apparatus according to claim 17, further including fogging electron amount distribution calculating means for calculating the fogging electron amount distribution, based on the exposure distribution and a spread distribution of fog electrons expanded from the irradiation region irradiated to the non-irradiation region.

19. The charged-particle beam writing apparatus according to claim 18, further including exposure distribution calculating means for calculating the exposure distribution, based on a pattern density distribution and a dose distribution set for every predetermined region of the sample.

20. The charged-particle beam writing apparatus according to claim 19, further including dose distribution calculating means for calculating the dose distribution, based on the pattern density distribution.

* * * * *